(12) United States Patent
Jones et al.

(10) Patent No.: US 11,821,839 B1
(45) Date of Patent: Nov. 21, 2023

(54) PASSIVE CHARACTERIZATION OF HIGH POWER OPTICAL FIBER AVERAGE POWER AND LP01 AND LP11 MODES BY DETECTING MIE SCATTERED LIGHT

(71) Applicant: Government of the United States, as represented by the Secretary of the Air Force, Wright-Patterson AFB, OH (US)

(72) Inventors: John G Jones, Dayton, OH (US); David E. Zelmon, Tipp City, OH (US); Frank K. Hopkins, Beavercreek, OH (US); Arianna M. McNamara, New Salisbury, IN (US); Michael D. Martin, Louisville, KY (US); Shamus P. NcNamara, New Salisbury, IN (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 309 days.

(21) Appl. No.: 17/373,858

(22) Filed: Jul. 13, 2021

Related U.S. Application Data

(60) Provisional application No. 63/057,998, filed on Jul. 29, 2020.

(51) Int. Cl.
*G01N 21/47* (2006.01)
*H01L 27/146* (2006.01)

(52) U.S. Cl.
CPC ....... *G01N 21/47* (2013.01); *H01L 27/14643* (2013.01); *G01N 2021/4719* (2013.01)

(58) Field of Classification Search
CPC ............ G01N 21/47; G01N 2021/4719; H01L 27/14643
See application file for complete search history.

(56) References Cited

U.S. PATENT DOCUMENTS

| 6,236,458 B1* | 5/2001 | Igushi ................ G01N 15/0211 |
| | | 356/336 |
| 2002/0162956 A1* | 11/2002 | Gharib .................. G01N 21/47 |
| | | 250/237 G |
| 2022/0020886 A1* | 1/2022 | Gureev ................ H01L 31/103 |

OTHER PUBLICATIONS

Hopkins, F. Kenneth, Nicholas G. Usechak, Hyunjun Kim, Xiaojin Wang, Hiren Trada, and Kevin M. Walsh. "Photodiode array for characterizing optical fibers." Applied Optics 57, No. 3 (2018): 409-413. (Year: 2018).*

(Continued)

*Primary Examiner* — Uzma Alam
*Assistant Examiner* — Mohamed Doumbia
(74) *Attorney, Agent, or Firm* — AFMCLO/JAZ; Timothy M. Barlow

(57) ABSTRACT

A scattered light detector comprises a first photodiode array comprising one or more photodiodes arranged in a planar, semicircular pattern on a substrate, each of the one or more photodiodes having an outer edge and an inner edge; and a notch perpendicular to the substrate and located adjacent the inner edge of each of the one or more diodes, and equidistant from the outer edges of each of the one or more photodiodes, the notch configured to accept an optical fiber oriented perpendicular to the plane of the one or more photodiodes. When there are two or more photodiodes, the photodiodes may be divided into two or more segments extending outwardly from the notch. Each of the photodiodes shares a common electrical ground. The planes of the one or more photodiodes of the first and second photodiode arrays are oriented parallel to each other and spaced a predetermined distance apart.

5 Claims, 17 Drawing Sheets
(15 of 17 Drawing Sheet(s) Filed in Color)

(56) References Cited

OTHER PUBLICATIONS

Xu, Lijun, Tianxiao Wei, Jiayi Zhou, and Zhang Cao. "Modified Landweber algorithm for robust particle sizing by using Fraunhofer diffraction." Applied Optics 53, No. 27 (2014): 6185-6193. (Year: 2014).*

Xu et al "Modified Landweber algorithm for robust particle sizing by using Fraunhofer diffraction." Applied Optics 53, No. 27 (2014): 6185-6193 (Year: 2014).*

Hopkins et al. "Photodiode array for characterizing optical fibers." Applied Optics 57, No. 3 (2018): 409-413 (Year: 2018).*

Dakin, J.P. et al., Angular Distribution of Light Scattering in Bulk Glass and Fibre Waveguides, Optics Communications, vol. 6, No. 3, Nov. 1972, pp. 235-238.

Reeve, M.H. et al., Studies of radiative losses from multimode optical fibres, Optical and Quantum Electronics 8 (1976) 39-42.

Hall, D.g., In-plane scattering in planar optical waveguides: refractive-index fluctuations and surface roughness, J. Opt. Soc. Am. A, vol. 2, No. 5, May 1985, 747-752.

Aldabaldetreku, G. et al., A comprehensive analysis of scattering in polymer optical fibers, Optics Express, Nov. 22, 2010, vol. 18, No. 24, pp. 24536-24555.

Eickhoff, W. et al., Determination of the Ellipticity of Monomode Glass Fibres From Measurements of Scattered Light Intensity, Electronics Letters Aug. 5, 1976 vol. 12 No. 16, pp. 405-406.

Hopkins, F.K., et al., In-plane scattering measurements in a planar optical waveguide by an integrated technique, Applied Optics, Aug. 15, 1981, vol. 20, No. 16, 2761-2763.

Payne, R., Modal Distribution of Backscattered Light in a Step-Index Multimode Fibre, Electronics Letters, Aug. 6, 1981 vol. 17 No. 16, pp. 568-570.

Qiang Fu et al., Mie theory for light scattering by a spherical particle in an absorbing medium, Applied Optics, vol. 40, No. 9, Mar. 20, 2001, pp. 1354-1361.

Tazaki, R., et al., Light Scattering by Fractal Dust Aggregates. I. Angular Dependence of Scattering, The Astrophysical Journal, 823:70 (16pp), Jun. 1, 2016, pp. 1-16.

Barnoski, M.K.,et al., Measurements in Fiber Optics, Proceedings of the IEEE, vol. 66, No. 4, Apr. 1978, 429-441.

Rawson E.G., Measurement of the Angular Distribution of Light Scattered from a Glass Fiber Optical Waveguide, Applied Optics, Nov. 1972, vol. 11, No. 11, 2477-2481.

Hopkins, F.K. et al., Photodiode array for characterizing optical fibers, Applied Optics, vol. 57, No. 3 , Jan. 20, 2018, pp. 409-413.

Bunge, C.A., Rayleigh and Mie Scattering in Polymer Optical Fibers, Journal of Lightwave Technology, vol. 24, No. 8, Aug. 2006, pp. 3137-3146.

Bisyarin, M.A., et al. Rayleigh backscattered radiation produced by an arbitrary incident mode in multimode optical fibers, Applied Optics, vol. 57, No. 22, Aug. 1, 2018, pp. 6534-6544.

Ribiero, R.M., et al., Non-disturbing optical power monitor for links in the visible spectrum using a polymer optical fibre, Meas. Sci. Technol. 26, 2015, 085201, pp. 1-7.

Hartog, A.H., et al., On the Theory of Backscattering in Single-Mode Optical Fibers, Journal of Lightwave Technology, vol. LT-2, No. 2, Apr. 1984, pp. 76-82.

Girard S., et al., Overview of radiation induced point defects in silica-based optical fibers, Reviews in Physics 4 (2019) 100032.

Wang Z., et al., Rayleigh scattering in few-mode optical fibers, Scientific Reports, 6:35844, DOI: 10.1038/srep35844.

Sa'ar A., et al., Scattering effects in crystalline infrared fibers, J. Opt. Soc. Am. A, vol. 5, No. 6, Jun. 1988, 823-833.

Freitas, T.A.M.G., et al., A simple and inexpensive optical power monitor for two visible wavelength WDM channels in plastic optical fibre links, Meas. Sci. Technol. 27, 2016, 127002.

Payne, D.N., et al., Determination of the Ellipticity of Monomode Glass Fibres From Measurements of Scattered Light Intensity, Electronics Letters, Aug. 5, 1976, vol. 12, No. 16, pp. 405-407.

Dakin, J.P., et al., Theory of Scattering From the Core of a Multimode Fibre Waveguide, Optics Communications, vol. 10, No. 2, Feb. 1974, pp. 195-199.

Aldabaldetreku, G.. et al., A comprehensive analysis of scattering in polymer optical fibers, Nov. 22, 2010 / vol. 18, No. 24 / Optics Express 24536.

* cited by examiner

Photodiode array

PASSIVE CHARACTERIZATION OF HIGH POWER OPTICAL FIBER AVERAGE POWER AND LP01 AND LP11 MODES BY DETECTING MIE SCATTERED LIGHT

Pursuant to 37 C.F.R. §1.78(a)(4), this application claims the benefit of and priority to prior filed Provisional Application Serial No. 63/057,998, filed 29 Jul. 2020, which is expressly incorporated herein by reference.

RIGHTS OF THE GOVERNMENT

The invention described herein may be manufactured and used by or for the Government of the United States for all governmental purposes without the payment of any royalty.

FIELD OF THE INVENTION

The present invention relates generally to beam diagnostics of high-power laser fiber and, more particularly, to information about the types and relative intensities of optical modes propagating within the fiber.

BACKGROUND OF THE INVENTION

Commercial fiber exhibits Mie scattering when excited by a fixed wavelength laser. Commercially-available polymer optical fiber (POF) commonly displays Mie scattering in addition to Rayleigh scattering. Existing sensors for beam diagnostics of high-power laser fiber are severely limited by the need to cut and splice tap-couplers onto the fiber and by the associated devices' power limitations; two tap-couplers are needed to simultaneously measure both forward and reverse propagating light.

It is common to measure the properties of light propagating in an optical fiber for beam diagnostics and characterization. Typically, one must sample the light in some manner because it is difficult to directly measure the light propagation. Most commonly, the methods utilized are either to measure the light out the end of the fiber, or to couple the light out of the optical fiber to another waveguide for further analysis. These techniques do not directly measure the light propagating within the fiber. Thus, the optical power is readily measured, but information about the types and relative intensities of optical modes propagating within the fiber is lost and must be inferred. This information is essential to understanding modal crosstalk, which is particularly important for mode division multiplexing.

Applications that utilize a high optical power present further limitations on the use of traditional methods for beam diagnostics because of the potential for sensor damage. Furthermore, insertion of a coupling waveguide requires splicing the sampling waveguide to the original fiber. This creates reflections at the splices, and the sampling waveguide may introduce mode instabilities. Observing the light scattered from within an optical fiber permits one to directly measure the propagating power and modes.

Rayleigh scattering from an optical fiber has been extensively studied, especially as a technique for measuring defects within an optical fiber. Scattering due to a variety of defects within the optical fiber and on the surface of the optical core of the fiber has also been studied. However, Mie scattering couples much more strongly to the defects and has a strong angular dependence, potentially providing a richer set of information to use for beam diagnostics.

What is desired is a way to use Mie scattered light to observe the propagating power and modes in an optical fiber, without cutting or splicing the optical fiber.

SUMMARY OF THE INVENTION

The present invention overcomes the foregoing problems and other shortcomings, drawbacks, and challenges of beam diagnostics of high-power laser fiber. While the invention will be described in connection with certain embodiments, it will be understood that the invention is not limited to these embodiments. To the contrary, this invention includes all alternatives, modifications, and equivalents as may be included within the spirit and scope of the present invention.

"About" or "approximately" means +/−10% or +/−5°, or any subrange thereunder.

According to one embodiment of the present invention, a scattered light detector comprises a first photodiode array comprising one or more photodiodes arranged in a planar, semicircular pattern on a substrate, each of the one or more photodiodes having an outer edge and an inner edge; and a notch perpendicular to the substrate and located adjacent the inner edge of each of the one or more diodes, and equidistant from the outer edges of each of the one or more photodiodes, the notch configured to accept an optical fiber oriented perpendicular to the plane of the one or more photodiodes.

According to a first variation, the scattered light detector includes two or more photodiodes.

According to a further variation, the two or more photodiodes are divided into two or more segments extending outwardly from the notch.

According to another variation, each of the one or more photodiodes shares a common electrical ground.

According to a further variation, the scattered light detector further includes a second photodiode array, wherein the planes of the one or more photodiodes of the first and second photodiode arrays are oriented parallel to each other and spaced a predetermined distance apart. The predetermined distance is about 1 mm. One (1) mm is a reasonable lower limit because the light has to spread out from the defect site. There is no upper limit; the scattered light may be projected onto a wall, for example.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention. The patent or application file contains at least one drawing executed in color. Copies of this patent or patent application publication with color drawing(s) will be provided by the Office upon request and payment of the necessary fee.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration. "About" or "approximate" indicates +/− 10% of the stated value. The various features presented may be combined in any combination desired in order to provide the desired performance characteristics.

DETAILED DESCRIPTION OF THE INVENTION

Existing sensors for beam diagnostics of high-power laser fiber are severely limited by the need to cut and splice tap-couplers onto the fiber and by the associated devices' power limitations. For example, forward- and reverse-propagating power in a fiber require two fiber tap couplers plus sensors spliced onto the fiber. Thus, the traditional approach is inconvenient by requiring cutting and splicing of the fiber while also being impractical with very high optical power due to laser damage to the tap couplers. As an alternative to the prior art, we utilize the physics of Mie scattering from the optical fiber core or equivalently from the imperfect core-clad interface as a means for sampling the laser light such that the fraction of light removed from the fiber is both insignificant and available without fiber splicing or cutting.

The average propagating power can be derived from the forward and backward scattered light intensities, and the mode structure can be derived from the interference pattern in the neighborhood (millimeters, both millimeters along the length from the scattering site, as well as millimeters away from the fiber in the radial direction) of the fiber assuming the laser line width is reasonably narrow. The sampling would be performed with a silicon-photonic device that is designed and fabricated to accurately position the uncut fiber and sense the scattered light. In addition, Mie scattering from a small section of fiber can be enhanced as required by various techniques such as perturbations to the fiber's core-to-cladding surface. The basic approach was recently demonstrated as an experimentally faster and more sensitive means than conventional approaches for measuring the attenuation of optical fiber. By utilizing Mie scattering, both forward and reverse-propagating average power in the fiber can be simultaneously measured with one device, along with mode-sensing capabilities.

Figure 1:
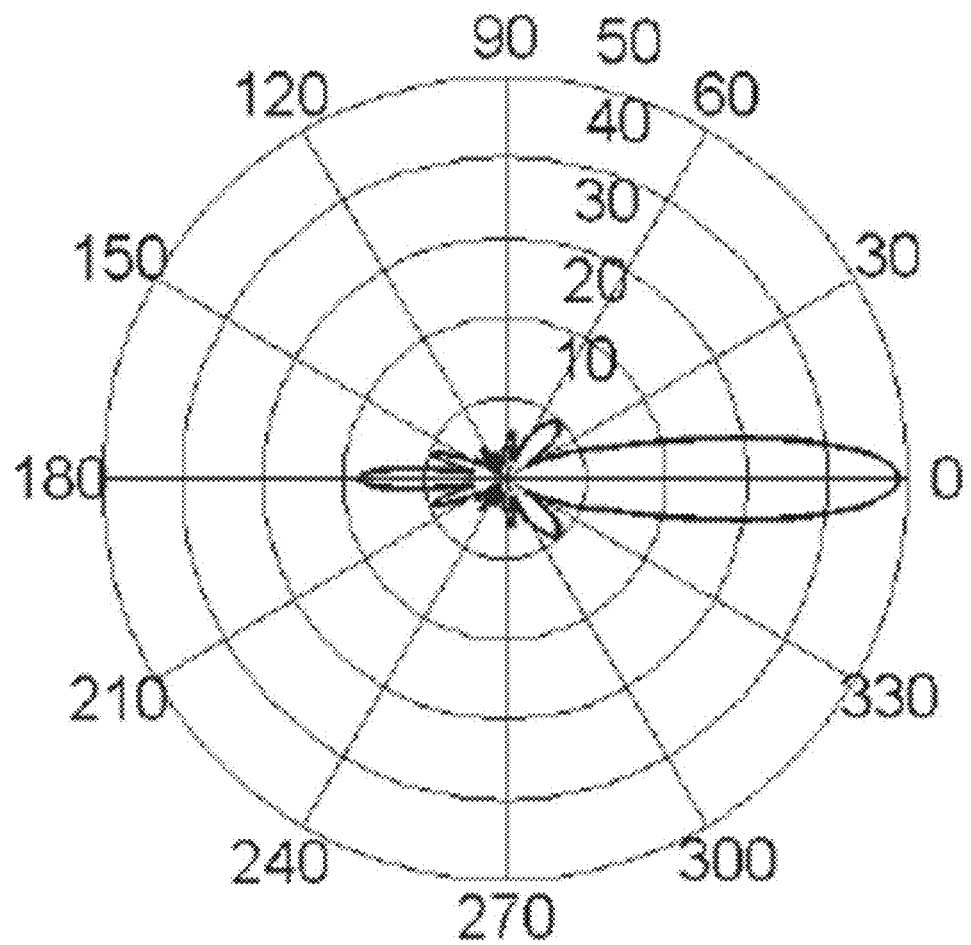
FIG. 1 illustrates the angular dependence of Mie scattering for $E_\theta$ versus $\theta$ ($\varphi=0$).
Figure 2:
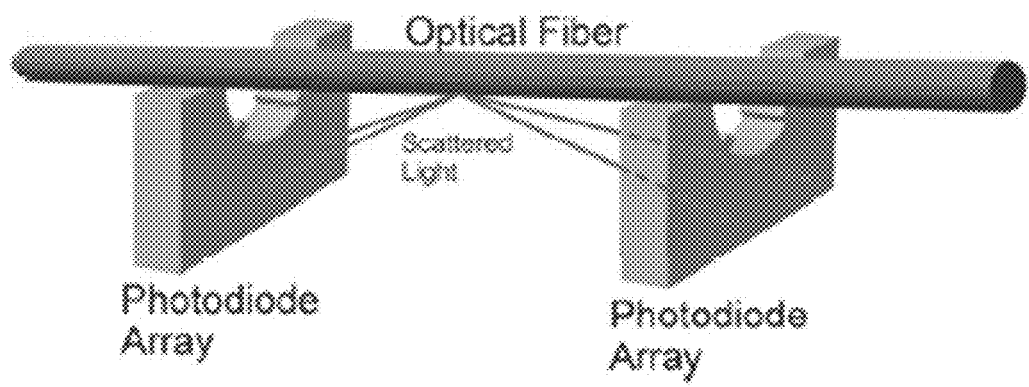
FIG. 2 illustrates two photodiode arrays spaced a distance apart with a fiber passed through a notch both photodiode arrays.

Mie scattering has a high angular dependence, as shown in FIG. 1 for x-polarized light. The forward and backward scattered light have different intensities and lobe shapes, making it desirable to measure scattering in both directions. The sensor described herein has been designed with semi-circular photodiodes, and where each photodiode covers approximately 60°. The fiber passes through the center of the photodiode plane. A conceptual layout of an embodiment of the photodiode is shown in FIG. 2.

Figure 3:
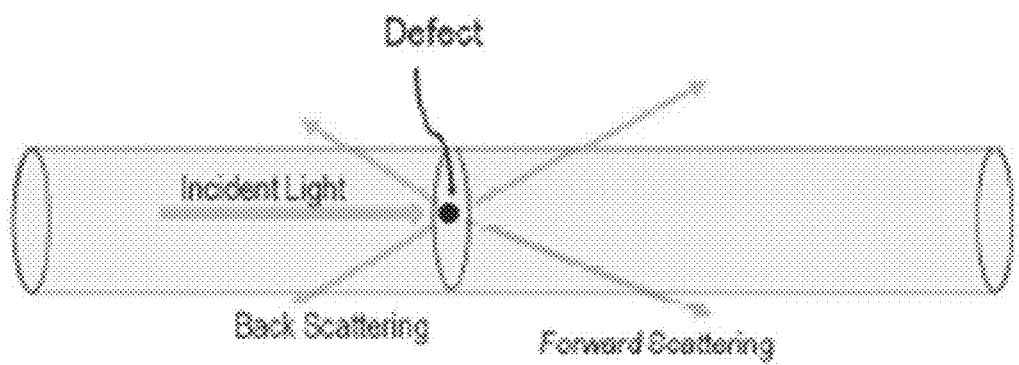
FIG. 3 illustrates the concept of Mie scattering.
Figure 4:
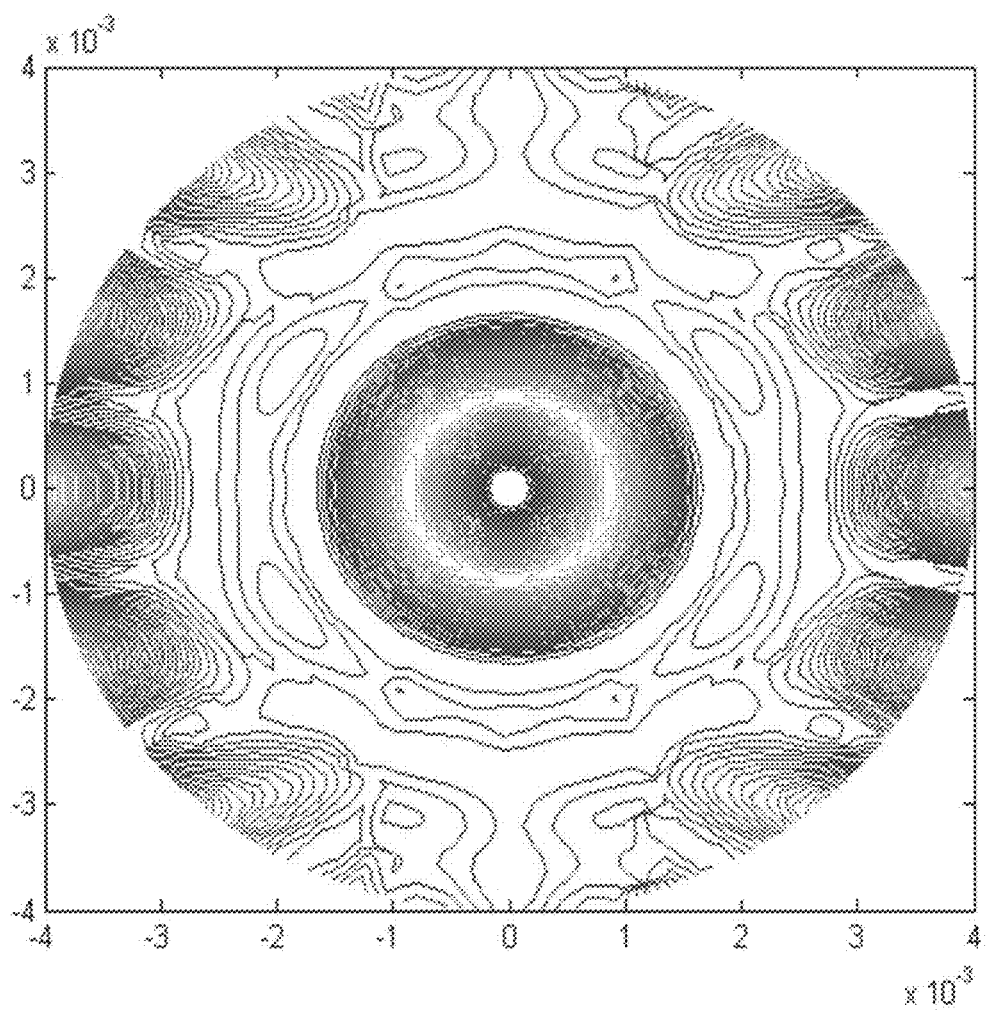
FIG. 4 presents the calculated light intensity arising from a plane of defects in the optical fiber ($r_{defect}=\lambda$) located 1 cm away from the photodiode array for the $LP_{01}$ mode.
Figure 5:
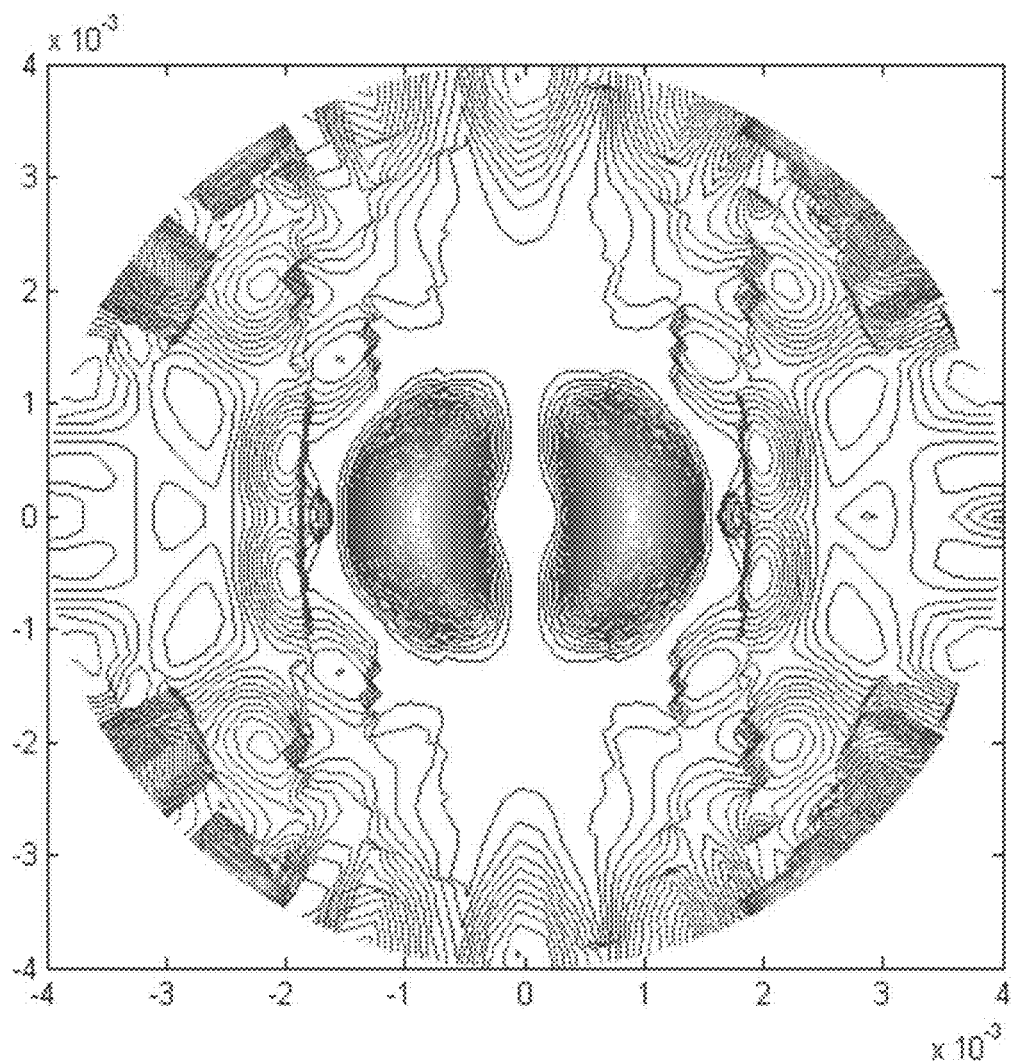
FIG. 5 presents the calculated light intensity arising from a plane of defects in the optical fiber ($r_{defect}=\lambda$) located 1 cm away from the photodiode array for the $LP_{11}$ mode.

To measure both forward and backward scattering, two photodiode arrays may be spaced a distance apart, e.g. 1 cm (FIG. 2), and the fiber passes through a notch both photodiode arrays. The amount of light leaving the optical fiber due to Mie scattering was calculated using the geometry shown in FIG. 3. FIGS. 4 and 5 present the calculated light intensity arising from a plane of defects in the optical fiber ($r_{defect}=\lambda$) located 1 cm away (axially) from the photodiode array. FIG. 4 presents results for a mode $LP_{01}$ and FIG. 5 presents results for the $LP_{11}$ mode.

We present a new approach for characterizing fiber-optic modes, power, and attenuation based upon sampling the confined light using a trivial quantity of Mie scattering. The fiber outcouplers traditionally used for sampling the confined light in optical fiber may be replaced by this much less-complicated approach. Mie scattering is the scattering of light by particles similar in size (approximately within an order of magnitude) to the wavelength of the light, and these scattering centers may naturally occur in or may be engineered into the fiber being characterized. Light scattering may for the purpose of measuring power flow and attenuation in a fiber optic cable, as well as the determination of the modes of propagation, were determined using the following methodology, with Table 1 providing the parameters necessary for the calculations.

| Symbol | MATLAB variable | Definition | Value Used |
|---|---|---|---|
| $n_1$ | N0 | Index of refraction of the fiber core | 1.4571 |
| $n_2$ | | Index of refraction of the fiber cladding | |
| $K_0$ | K0 | Wavenumber in the fiber. $K_{air} \cdot n_1$ | $1.4469 \times 10^7$ m$^{-1}$ |
| $n_{defect}$ | *should be Nd* | The refractive index of the defect | N0$^2$ |
| n | N0 *should be N* | The relative refractive index of the defect with respect to the core. $n = \frac{n_{defect}}{n_1}$ | N0 |
| $r_{core}$ | rcore | Radius of the fiber core | $2.9 \times 10^{-6}$ m |
| $r_{clad}$ | rclad | Radius of the fiber cladding | $122 \times 10^{-6}$ m |

-continued

| Symbol | MATLAB variable | Definition | Value Used |
|---|---|---|---|
| U | | Constant used for calculating the wave propagation in a fiber | |
| $U_0$ | U0 | Constant for $LP_{01}$ mode | 2.402 |
| $U_1$ | U1 | Constant for $LP_{11}$ mode | 2.8777 |
| $\beta$ | B | Size parameter for defects. $\beta = n \cdot K_0$ | |
| $\beta_0$ | B0 | Propagation constant for $LP_{01}$ mode | $1.442 \times 10^7$ m$^{-1}$ |
| $\beta_1$ | B1 | Propagation constant for $LP_{11}$ mode | $1.4409 \times 10^7$ m$^{-1}$ |
| $E_0$ | C | Constant related to the magnitude of the incident electric field. $C = E_0\text{?? ?}^{***}$ | $1 \times 10^9$ V/m |
| a | | Radius of the defects | $6.33 \times 10^{-7}$ m (633 nm) |
| D | | Defect Density | $1 \times 10^5$ m$^{-3}$ |

The following is how the constants were calculated for our test case. In the fiber optic we have a numerical aperture of NA=0.140, a core radius of $r_{core}$=2.9µm, and a cutoff wavelength of 920±30 nm.

From these given values we are able to determine that the V number is $$V = \frac{2\pi a}{\lambda} NA = 4.05 \text{ for } \lambda = 630\text{nm}.$$

This means that only $LP_{01}$, $LP_{11}$, $LP_{02}$, and $LP_{12}$ modes will propagate in the fiber. Only the $LP_{01}$ and $LP_{11}$ modes are discussed below.

The core refractive index was estimated to be $n_1$=1.4571 which, using NA=$\sqrt{n_1^2 - n_2^2}$, gives us $n_2$=1.45036. This seems like a reasonable number with $n_1 \sim n_2$.

The wavenumber in the fiber is $K_0 = n_1 \cdot K_{air}$ = 1.4469×$10^7$m$^{-1}$. From this we find the propagation constants of the modes: Numerically solving a set of transcendental equations for the normalized propagation constant***, b, gives $b_0$=0.529 for $LP_{01}$ and $b_1$=0.324 for $LP_{11}$ modes, and $$b_{0,1} = \frac{\left(\left(\frac{\beta_{0,1}^2}{K_0^2}\right) - n_2^2\right)}{NA},$$

so we get $\beta_0$=1.442×$10^7$m$^{-1}$ for $LP_{01}$ modes, and $\beta_1$=1.4409×$10^7$m$^{-1}$ for $LP_{11}$ modes.

Finally, we must calculate $U_{0,1} = V\sqrt{1-b_{0,1}} = r_{core}(k_0^2 N_1^2 - \beta_{0,1}^2)^{0.5}$ for each mode. This gives U=2.402 for $LP_{01}$ and $U_1$=2.877 for $LP_{11}$ modes.

Mode Shape within the fiber:

The equations for the electric fields (for x-polarized light) in the modes are $$E_i = \frac{A}{J_0(U_0)} J_0\left(\frac{U_0 r_p}{r_{core}}\right) e^{i\beta_0 z} \hat{x}$$

for the $LP_{01}$ mode and $$E_i = \frac{A}{J_1(U_1)} J_1\left(\frac{U_1 r_p}{r_{core}}\right) e^{i\beta_1 z} \cos(\varphi_p) \hat{x}$$

$$E_i = \frac{A}{J_1(U_1)} J_1\left(\frac{U_1 r_p}{r_{core}}\right) e^{i\beta_1 z} \sin(\varphi_p) \hat{y}$$

for the $LP_{11}$ mode, where A is the magnitude of the electric field, and $J_0$ and $J_1$ are Bessel functions of the first kind.

Mie Scattering from a Dielectric Sphere:

Using the far field approximation, the Mie scattering from a single defect in x-polarized light is given by $$E_\theta = -E_i \frac{i\cos(\varphi_{mie}) e^{iK_0 r}}{K_0 r} S_1(\theta)$$

$$E_\phi = E_i \frac{i\sin(\varphi_{mie}) e^{iK_0 r}}{K_0 r} S_2(\theta)$$

where $E_i$ is the incident light intensity, and $$S_1(\theta) = \sum_{l=1}^{\infty} \frac{2l+1}{l(l+1)} (a_l \tau_l + b_l \pi_l)$$

and $$S_2(\theta) = \sum_{l=1}^{\infty} \frac{2l+1}{l(l+1)} (a_l \pi_l + b_l \tau_l).$$

For $$\pi_l = \frac{P_l^1(\cos(\theta))}{\sin(\theta)},$$

$$\tau_l = \frac{aP_l^1(\cos(\theta))}{d\theta},$$

$$a_l = \frac{\psi_l(\beta)\psi_l'(n\beta) - n\psi_l(n\beta)\psi_l'(\beta)}{\zeta_l^{(1)}(\beta)\psi_l'(n\beta) - n\psi_l(n\beta)\zeta_l^{(1)'}(\beta)},$$

and $$b_l = \frac{\psi_l(n\beta)\psi_l'(\beta) - n\psi_l'(n\beta)\psi_l(\beta)}{\zeta_l^{(1)'}(\beta)\psi_l(n\beta) - n\zeta_l^{(1)}(\beta)\psi_l'(n\beta)}.$$

$$\psi_l(z) \equiv zj_l(z)$$

$$j_l(z) = \sqrt{\frac{\pi}{2z}} J_{l+\frac{1}{2}}(z)$$

$$y_l(z) = \sqrt{\frac{\pi}{2z}} Y_{l+\frac{1}{2}}(z)$$

$$\zeta^{(1,2)}(z) \equiv zh^{(1,2)}{}_l(z) = zj_l(z) \pm izy_l(z)$$

$$\Psi_l'(z) = (l1) j_l(z) - zj_{l+1}(z)$$

$$\zeta^{(1)'}(z) = (l+1) j_l(z) - zj_{l+1}(z) + i((l+1) y_l(z) - izy_{l+1}(z))$$

Where n is the relative refractive index of the defect to the fiber core $$n = \frac{n_{defect}}{n_1},$$

$\beta = K_0 \cdot a$, a is the radius of the defect, r is the distance from the defect, $P^1_l$ are the associated Legendre polynomials, $j_l(z)$ are the spherical Bessel functions of the first kind, $J_l(z)$ are the Bessel functions of the first kind, $y_l(z)$ are the spherical Bessel functions of the second kind, $Y_l(z)$ are the Bessel functions of the second kind, and ' indicates differentiation with respect to the argument.

Integration over a single slice of the fiber:

To get the electric field intensity from a slice of the fiber at a point on the photodiode plane (z=0), integrate the scattered light, taking $E_l$ as the electric field due to the light traveling in the fiber optic, over the surface of the slice of the fiber. Using equations 1 and 2 together to get the electric field intensity at a point for $E_\theta$ (The Eq components are found similarly):

$$E_\theta = \int\int \left( -\frac{A}{J_0(U_0)} J_0\left(\frac{U_0 r_p}{r_{core}}\right) e^{i\beta_0 z} \frac{i\cos(\varphi_{mie}) e^{iK_0 r}}{K_0 r} S_1(\theta) \right) r_p d\phi dr_p$$

for $LP_{01}$ modes, and $$E_\theta = \int\int \left( -\frac{A}{J_1(U_1)} J_1\left(\frac{U_1 r_p}{r_{core}}\right) e^{(i\beta_1 z)} \cos(\varphi_p) \frac{i\cos(\varphi_{mie}) e^{iK_0 r}}{K_0 r} S_1(\theta) \right) r_p d\phi dr_p$$

for $LP_{11}$ modes. The integration is carried out over the range $0 \leq \varphi \leq 2\pi$ and $0 \leq r_p \leq \alpha$.

$$r = \sqrt{r_p^2 + r_d^2 - 2r_p r_d \cos(\varphi_p - \varphi_{mie}) + z^2}$$

where r is the distance the light travels from within the fiber to the photodiode. $\varphi_p$ and $r_p$ are the coordinates of a point in the fiber, z is the distance between the slice of the fiber and the diode plane, and $\sim_{mie} \sim \varphi_d$ and $r_d$ are the coordinates of a point on the diode plane.

It was assumed that θ' was constant for any point on the fiber slice with respect to a specific point on the diode plane. This allowed us to compute $S_1(\theta)$ and $S_2(\theta)$ only once for all points in the slice of the fiber and the subsequent integration.

The time average Poynting vector is $$\vec{P}_{tm} = \frac{1}{2} \vec{E} \times \vec{H}^*$$

where $$H = \frac{E}{N0} \text{ and } \vec{E} \times \vec{H}$$

points in the direction of wave propagation. Or equivalently, $$\vec{P}_{tm} = \frac{1}{2} \sqrt{\frac{\epsilon}{\mu}} |\vec{E}|^2$$

$\vec{P}_{tm}$ was calculated from $E_\theta$ and $E_\varphi$ individually and then the vectors were added because they both point in the radial direction.

Note: Refraction of light was not taken into account for this calculation, and transmission coefficients were not calculated (assumed to be 1).

Integration over length or angle:

Computing the series for $S_1(\theta)$ and $S_2(\theta)$ had the potential to be very time intensive, and integrating over the length slice by slice may require recalculating them for each step $\partial z$, so we implemented a more efficient way of doing the calculation.

Instead of integrating over the length of the fiber directly, we integrate over the angle that the point on the photodiode plane makes with the fiber, $\theta_r$. The angle of propagation within the fiber, $\theta_r$, is found from the relative index of refraction. This is then used for calculating $$S_1\left(\frac{\pi}{2} - \theta_i\right) \text{ and } S_2\left(\frac{\pi}{2} - \theta_i\right).$$

The surface integral is computed over the slice of the fiber for each $\theta_r$ to find the electric field at D due to $\theta_r$, multiply it by the volume of the fiber (V) between steps, and add the calculated value to the total electric field intensity at that point. We do this at every point in the photodiode plane, and loop through the process by stepping $\theta_r$ every time.

The surface integral:

We choose the distance, d, from the point D on the photodiode to the point M where the light leaves the fiber cladding when ignoring vertical distance. This provides us with two possible positions for M (M1 and M2) as well as defining angles calculated using Snell's law:

$$\varphi_t = \pi - \frac{\operatorname{acos}(r_{clad}^2 + d^2 - r_d^2)}{2 \cdot r_{clad} \cdot d}$$

and $$\varphi_i = \operatorname{asin}\left(\frac{n_{air}}{n_{glass}} \sin(\varphi_t)\right)$$

In our case, $n_{air}/n_{glass} = 0.69$. We then find the distance, dr, from M to the point P of scattering. This determines the distance $$rp = \overline{PO} = \sqrt{r_{clad}^2 + d_r^2 - 2 \cdot d_r \cdot r_{clad} \cos(\varphi_i)}$$

$$\varphi_{p1} = \operatorname{mod}\left(\varphi_d + \operatorname{acos}\left(\frac{r_p^2 + r_{clad}^2 - d_r^2}{2r_p r_{clad}}\right) + \operatorname{acos}\left(\frac{r_d^2 + r_{clad}^2 - d^2}{2r_d r_{clad}}\right), 2\pi\right)$$

$$\varphi_{p2} = \operatorname{mod}\left(\varphi_d - \operatorname{acos}\left(\frac{r_p^2 + r_{clad}^2 - d_r^2}{2r_p r_{clad}}\right) - \operatorname{acos}\left(\frac{r_d^2 + r_{clad}^2 - d^2}{2r_d r_{clad}}\right), 2\pi\right)$$

Figure 6:
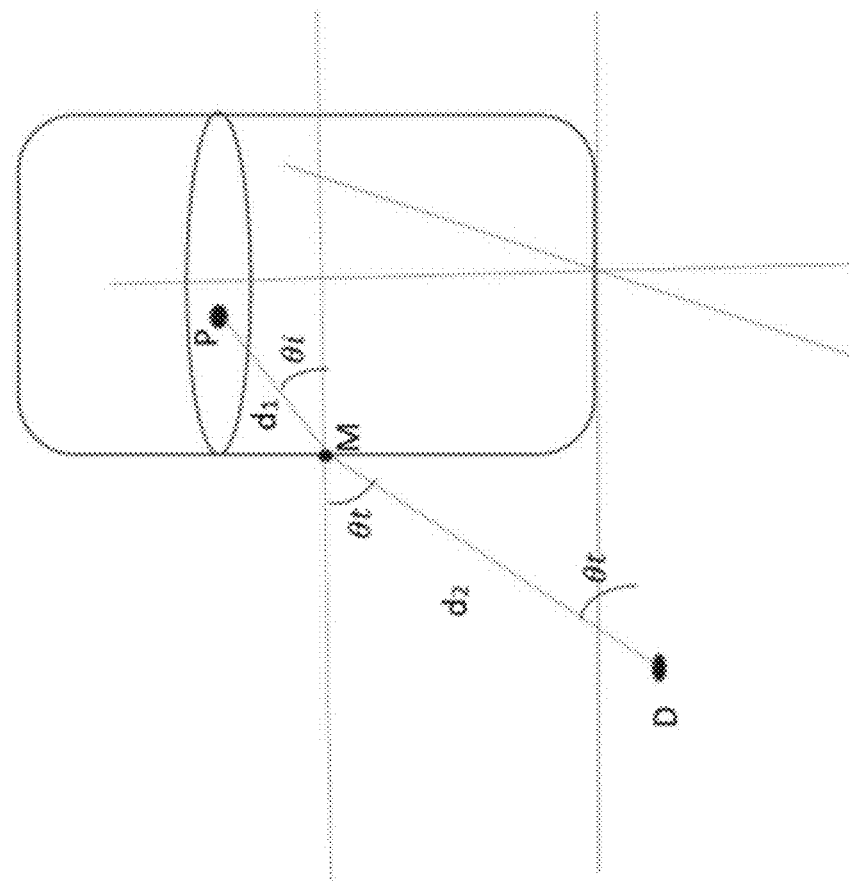
FIG. 6 illustrates the geometry and angles used for performing the scattered light calculations.
Figure 6:
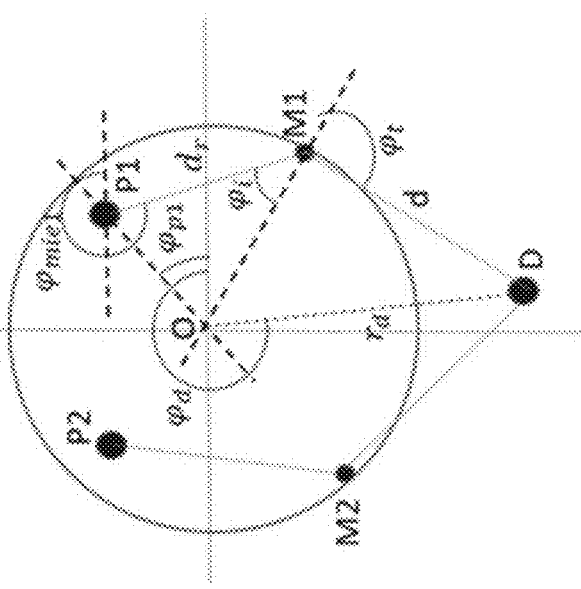

See FIG. 6

We now take into account the vertical direction, beginning by finding the height from D to M as $ze = -d \cdot \tan(\theta_r)$ where the minus sign indicates that the incident light traveling in the forward direction and the diode plane (containing D) is at z=0. We next find the vertical distance from M to P as zp=$-d_r \cdot \tan(\theta_i)$. The total height from O to P as $z_{tot}$=zp+ze.

We now use d, $d_r$, ze, and zp to determine the distance the scattered light travels inside the fiber ($d_1$) and outside the fiber ($d_2$):

$$d_1 = \sqrt{d_r^2 + zp^2}$$

$$d_2 = \sqrt{d^2 + ze^2}.$$

From before, we have $$E_\theta = \int\int \left(-\frac{A}{J_1(U_1)} J_1\left(\frac{U_1 r_p}{r_{core}}\right) e^{(i\beta_1 z)} \cos(\varphi_p) \frac{i\cos(\varphi_{mie}) e^{iK_0 r}}{K_0 r} S_1(\theta)\right) r_p d\phi dr_p$$

for the $LP_{11}$ modes.

To convert between this equation and the variables used in Matlab:

$\cos(\varphi_p)\cos(\varphi_{mie}) = \cos(\varphi_{p1})$    $\cos(\varphi_{mie1}) + \cos(\varphi_{p2})\cos(\varphi_{mie2})$, for $$\varphi_{mie1} = \pi + a\cos\left(\frac{r_P^2 + d_r^2 - r_{clad}^2}{2 r_P \cdot d_e}\right) + \varphi_{p1}$$

and $$\varphi_{mie2} = \pi - a\cos\left(\frac{r_P^2 + d_r^2 - r_{clad}^2}{2 r_P \cdot d_r}\right) + \varphi_{p2},$$

z=$Z_{tot}$ $$K_0 r = K_0 \cdot d1 + \frac{K_0}{n_1} d2$$

K0r includes the path within the fiber and the path external to the fiber.

This becomes $E_0 = E_{01} + E_{02}$ for $$dE_{\theta 1} = \left(-J_1\left(\frac{U_1 r_p}{r_{core}}\right) e^{(i\beta_1 z_{tot})} \cos(\varphi_{p1}) \frac{i\cos(\varphi_{mie1}) e^{i\left(K_0 d_1 + \frac{K_0}{n_1} d_2\right)}}{K0 d_1 + \frac{K0}{n_1} d_2} S_1\left(\frac{\pi}{2} - \theta_i\right)\right)$$

$$dE_{\theta 2} = \left(-J_1\left(\frac{U_1 r_p}{r_{core}}\right) e^{(i\beta_1 z_{tot})} \cos(\varphi_{p2}) \frac{i\cos(\varphi_{mie2}) e^{i\left(K_0 d_1 + \frac{K_0}{n_1} d_2\right)}}{K_0 d_1 + \frac{K_0}{n_1} d_2} S_1\left(\frac{\pi}{2} - \theta_i\right)\right)$$

where we integrate over d and $d_r$ to get $E_{01}$ and $E_{02}$.

Because the angles between P and D vary with varying P for the same D, we convert $E_0$ into Cartesian components:

$$dE_{\theta x} = \cos\left(\theta_t + \frac{\pi}{2}\right) \cdot \cos\left(2\pi - \varphi_t - a\cos\left(\frac{r_P^2 + r_{clad}^2 - d_r^2}{2 r_{clad} \cdot r_P}\right) - \varphi_{p1}\right) dE_{\theta 1} +$$
$$\cos\left(\theta_t + \frac{\pi}{2}\right) \cdot \cos\left(\pi + \varphi_t + a\cos\left(\frac{r_{clad}^2 + r_P^2 - d_r^2}{2 r_P \cdot r_{clad}}\right) - \pi + \varphi_{p2}\right) dE_{\theta 2},$$

-continued $$dE_{\theta y} = \cos\left(\theta_t + \frac{\pi}{2}\right) \cdot \sin\left(2\pi - \varphi_t - a\cos\left(\frac{r_P^2 + r_{clad}^2 - d_r^2}{2 r_{clad} \cdot r_P}\right) - \varphi_{p1}\right) dE_{\theta 1}$$
$$+ \cos\left(\theta_t + \frac{\pi}{2}\right) \cdot \sin\left(\pi + \varphi_t + a\cos\left(\frac{r_{clad}^2 + r_P^2 - d_r^2}{2 r_P \cdot r_{clad}}\right) - \pi + \varphi_{p2}\right) dE_{\theta 2},$$

and $dE_{\theta z} = -\sin\left(\theta_t + \frac{\pi}{2}\right) dE_\theta.$

Next, we must multiply by the vertical distance between steps (which we call V because it enables us to integrate over a volume). Because rcore <<rd and $\theta t \to \infty$ we can assume that the faces integrated over for each $\theta T$ are parallel and V (rd-rclad)(tan($\theta$next)-tan($\theta$t)).

Finally, we must take into account the transmission coefficients, which determines how much light escapes the fiber optic. $E_\theta$ is p-polarized and $E_\varphi$ is s-polarized. From Fresnel's equation, we have:

$$T_p = 1 - \left|\frac{n_1 \cdot \cos(\theta_t) - \cos(\theta_i)}{n_1 \cos(\theta_t) + \cos(\theta_i)}\right|^2$$

$$T_s = 1 - \left|\frac{n_1 \cos(\theta_i) - \cos(\theta_t)}{n_1 \cos(\theta_i) + \cos(\theta_t)}\right|^2$$

Putting it all together:
Finally, we assume a uniform defect density D, and get
$E_{\theta x} = \int\int DT_p V dE_{\theta x}$,
$E_{\theta y} = \int\int DT_p V dE_{\theta y}$,
$E_{\theta z} = \int\int DT_p V dE_{\theta z}$,
$E_{\varphi x} = \int\int DT_s V dE_{\varphi x}$,
$E_{\varphi y} = \int\int DT_s V dE_{\varphi y}$,
and
$E_{\varphi z} = \int\int DT_s V dE_{\varphi z}$, The region to be integrated is:
$\int_{d_{min}}^{d_{max}} \int_{d_{r,min}}^{d_{r,max}} (\quad) dd_r dd$
where the bounds of the integrals are:
$d_{min} = r_d - r_{core}$
$d_{max} = \sqrt{r_d^2 - r_{core}^2}$ $$d_{r,min} = \sqrt{r_{clad}^2 + r_{core}^2 - 2 r_{clad} \cdot r_{core} \cdot \cos\left(a\sin\left(\left(\frac{r_{clad}}{r_{core}}\right)\sin(\varphi_i)\right) - \varphi_i\right)},$$

$$d_{r,max} = \sqrt{r_{clad}^2 + r_{core}^2 - 2 r_{clad} \cdot r_{core} \cdot \cos\left(\pi - \varphi_i - a\sin\left(\left(\frac{r_{clad}}{r_{core}}\right) \cdot \sin(\varphi_i)\right)\right)}$$

Note that the limits of integration are set up to integrate over the core, but not the cladding.

After doing similar things for $E_{100}$, we get $E_x = E_{\theta x} + E_{\varphi x}$, $E_Y = E_{\theta y} + E_{\varphi y}$, and
$E_z = E_{\theta z} + E_{\varphi z}$. This allows us to calculate the time average Poynting vector as $$\vec{P}_{tm} = \frac{1}{2} \vec{E} \times \vec{H}^*, \text{ or } \vec{P}_{tm} = \frac{1}{2} \sqrt{\frac{\epsilon}{\mu}} |\vec{E}|^2$$

where $$H = \frac{E}{N0} \text{ and } \vec{E} \times \vec{H}$$

points in the direction of wave propagation.

Figure 7:
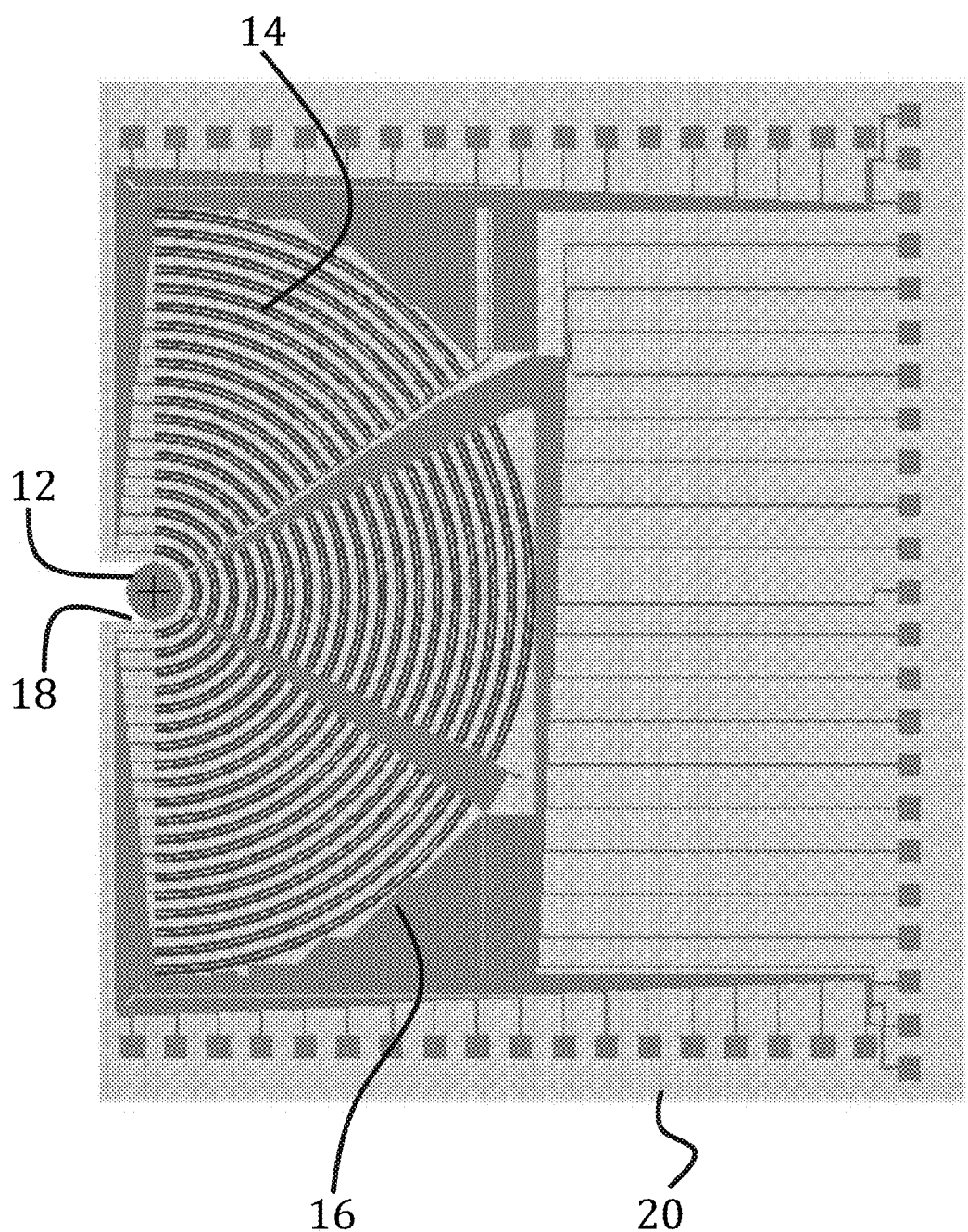
FIG. 7 illustrates a typical photodiode array layout.
Figure 8:
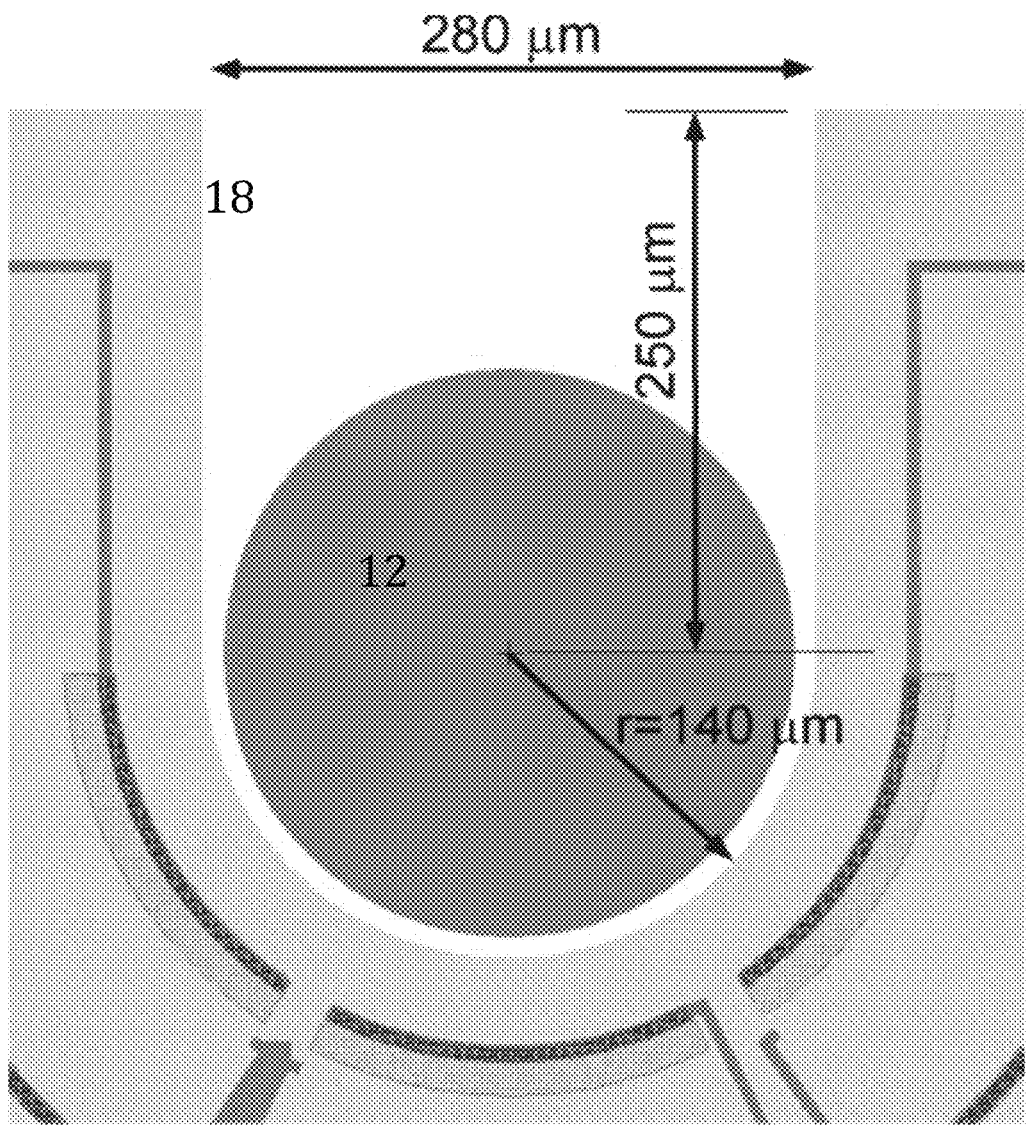
FIG. 8 illustrates notch dimensions for an embodiment of the invention.
Figure 9:
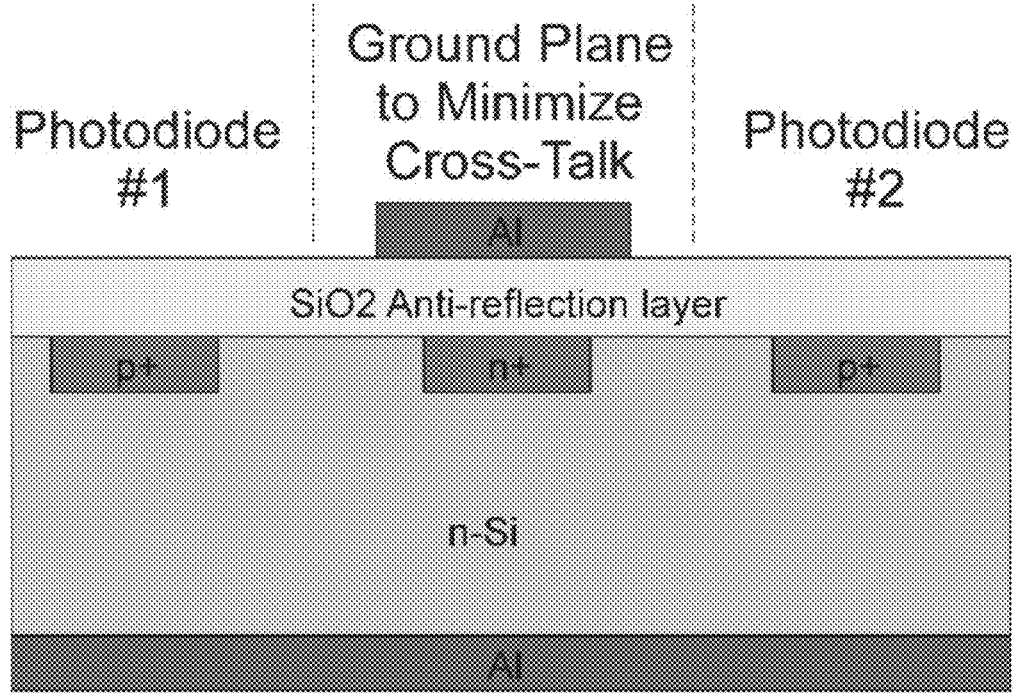
FIG. 9 presents a cross-section of an embodiment of the photodiode array.
Figure 10:
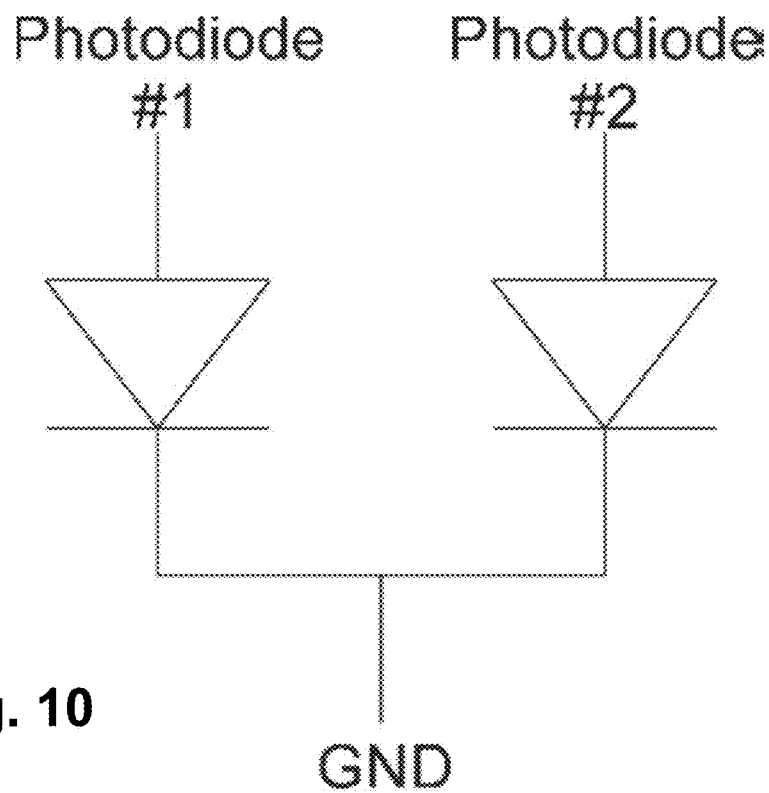
FIG. 10 presents a circuit schematic for an embodiment of the photodiode array.

Herein, a planar photodiode, i.e. sensor or detector, array 10 is used to detect the scattered light and determine the modes and power in an optical fiber 12 that 'glows' due to Mie scattering. In one example (see FIG. 7), the photodiode array 10 may comprise 57 diodes 14 arranged in three 60° concentric circle slices 16, i.e. 19 diodes in each 60° section, and mounted on a substrate 20, e.g. Si. A notch 18 in the array 10 allows the fiber 12 to be centered in the diode array 10. Light having a frequency greater than the single mode cutoff frequency will propagate with multiple sets of angular and radial dependencies. The apparatus allows for the identification of the modes propagating within the fiber, and their respective intensities, particularly the $LP_{01}$ and $LP_{11}$ modes. Different numbers of diodes may be used, as well as different configurations. For example, few diodes may be used in the radial direction for simply a measurement, or more measurements may be used in the radial direction to obtain better radial accuracy. Similarly, more diodes may be used in the angular direction to increase the angular sensitivity. This may be useful for measuring the scattered light from optical fibers that contain many modes of propagation with a high angular dependence, such as the $LP_{2x}$ modes or $LP_{3x}$ modes, where x refers to a variety of possible modes. FIG. 7 illustrates a configuration of the notch 18 with a sectional view of an optical fiber 12 in the notch 18. FIG. 8 illustrates notch dimensions for an embodiment of the invention. FIG. 9 presents a cross-section of an embodiment of the photodiode array. FIG. 10 presents a circuit schematic for an embodiment of the photodiode array.

Assuming a uniform defect density, we have calculated the expected light intensity due to Mie scattering on the photodiode array by integrating the mode light intensity in a slice (i.e. a cross-sectional area of the fiber) of the fiber and then integrating over the length of that fiber. Our results from these calculations show that the expected light intensity in the plane of the photodiode sensor array matches very closely with their respective modes, so will be able to identify them with the disclosed photodiode array.

In the application of High Power Fiber Systems, this invention adds the ability to measure forward and reverse power simultaneously, as well as to determine the propagation modes of $LP_{01}$ and $LP_{11}$. These parameters, determined in real-time, may in turn be used to prevent overdriving the fiber into catastrophic failure, and may be implemented passively without splicing or cutting the fiber. This is the optical equivalent of a clamp-on meter (in an electrical wiring scenario) that may be used to passively measure the current passing through a wire, with both cases, i.e. electrical and optical, requiring calibration initially. In the optical fiber case, MIE scattering of light from the high power fiber is measured directly; for the electrical wiring example, a current flowing through a wire is determined by using a Hall sensor to measure the magnetic field which is correlated to current flow through a conductor.

By observing Mie scattered light that escapes the optical fiber, it is possible to measure the power and propagating modes without disturbing the optical beam because most photons are not scattered from the fiber optic, permitting the majority of the light to continue its propagation undisturbed. The intensity of scattered light escaping the fiber is utilized as the principle of an optical power monitor. The direction of propagation of the scattered light is used to determine the mode shape.

In addition, one may utilize the physics of Mie scattering from the optical fiber core or equivalently from the imperfect core-clad interface as a means for independently measuring the forward-propagating light and reverse-propagating light using two detectors, as illustrated in FIG. 2. Since Mie scattering is primarily into the forward hemisphere, the measured forward-scattered light (as compared with the measured reverse-scattered light) would provide an estimate of the power of the forward-propagating light in the fiber with a first detector while simultaneously estimating the reverse-propagating light with a second detector. If desired, defects may be intentionally introduced into a small segment of the fiber in order to enhance Mie scattering.

Calculations indicate that if the light propagating in the fiber has a narrow linewidth, e.g. 1 nm or smaller, the scattered light will form a diffraction pattern in the plane normal to the fiber and near the fiber. Accordingly, it is possible to discern an $LP_{01}$ mode from an $LP_{11}$ mode based on the distinct diffraction patterns.

Commercial optical fiber exhibits Mie scattering when excited by a fixed wavelength laser. Commercially-available polymer optical fiber (POF) commonly displays Mie scattering in addition to Rayleigh scattering. The disclosed method is valid for any of these fiber types to both correlate to average power delivered, as well as $LP_{01}$ or $LP_{11}$ modes of operation.

These parameters, determined in real-time, may in turn be used to prevent over-driving the fiber into catastrophic failure or damaging the source laser from back reflections, and may be implemented passively without splicing or cutting the fiber in critical applications of fiber communication, laser welding, and additive laser materials processing, as well as LIDAR applications.

EXPERIMENTAL

The setup includes a first photodiode array placed around an optical fiber (see FIG. 7), thus allowing beam diagnostics by directly measuring the intensity pattern of the scattered light, without any tapping of the fiber or observing the light emission from the end of the fiber. The photodiode array includes elements, i.e. diodes, that allow the angular and radial intensity dependence of the scattered light from the fiber to be measured, and from the pattern detected by the photodiode array the mode of the fiber may be determined between, for example, $LP_{01}$ and $LP_{11}$. FIG. 2 illustrates exemplary locations of the detectors. FIG. 7 illustrates an exemplary arrangement of the photodiodes on the detectors.

$LP_{01}$ modes are characterized by fully circular intensity patterns of constant angular intensity with varying radial intensity (see FIG. 4); $LP_{11}$ scattered light is characterized as having a radial and intensity pattern represented by a pair of symmetric hemispheres having intensity variations both radially and angularly (see FIG. 5). The laser excites the MIE scattering effect in concert with an optical fiber. The photodiode array is designed to detect the angular and radial distribution of light scattered from an optical fiber; the detector is perpendicular to the fiber, as illustrated in FIG. 2. The diodes of the detector array may be arranged with a 60-degree angular resolution, and varying radial resolution. The radial resolution is varied by changing the number and spacing of the diodes in the radial direction (see FIG. 7). The angular resolution may be any desired value, depending on the desired performance characteristics, e.g. 5°, 10°, 20°, 30°, 40°, 50°, 60°, 70°, 80°, 90°, up to 360°, and any range or subrange thereof. For this demonstration, the silicon die size is ~5 mm=5 mm, with between one (1) and 57 diodes per die, depending on the design. Photodiodes may be arranged in 60-degree segments or in a single 180° arc. The radius of the photodiode region is about 1.76 mm. The photodiode region extends from the notch to the outer radius of the arcs of diodes (see FIG. 7, element 14). This exemplary design is optimized for 632 nm light. A ground plane (see FIGS. 9-10) may be used to reduce signal cross-talk between photodiodes. A notch 18 is placed for the optical fiber 12 to rest in position to facilitate natural alignment of the sensor 10 and fiber 12. The notch 18 extends from the center of one edge of the sensor 10 and is deep enough and wide enough to position the fiber 12. A single layer anti-reflection coating may be used to minimize optical reflection at 632 nm. The calculated reflectivity of the sensor with the anti-reflection coating is 8.6% at 632 nm. The cathodes of each of the photodiodes may be tied to a single ground, as illustrated in FIGS. 9-10.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Figure 11:
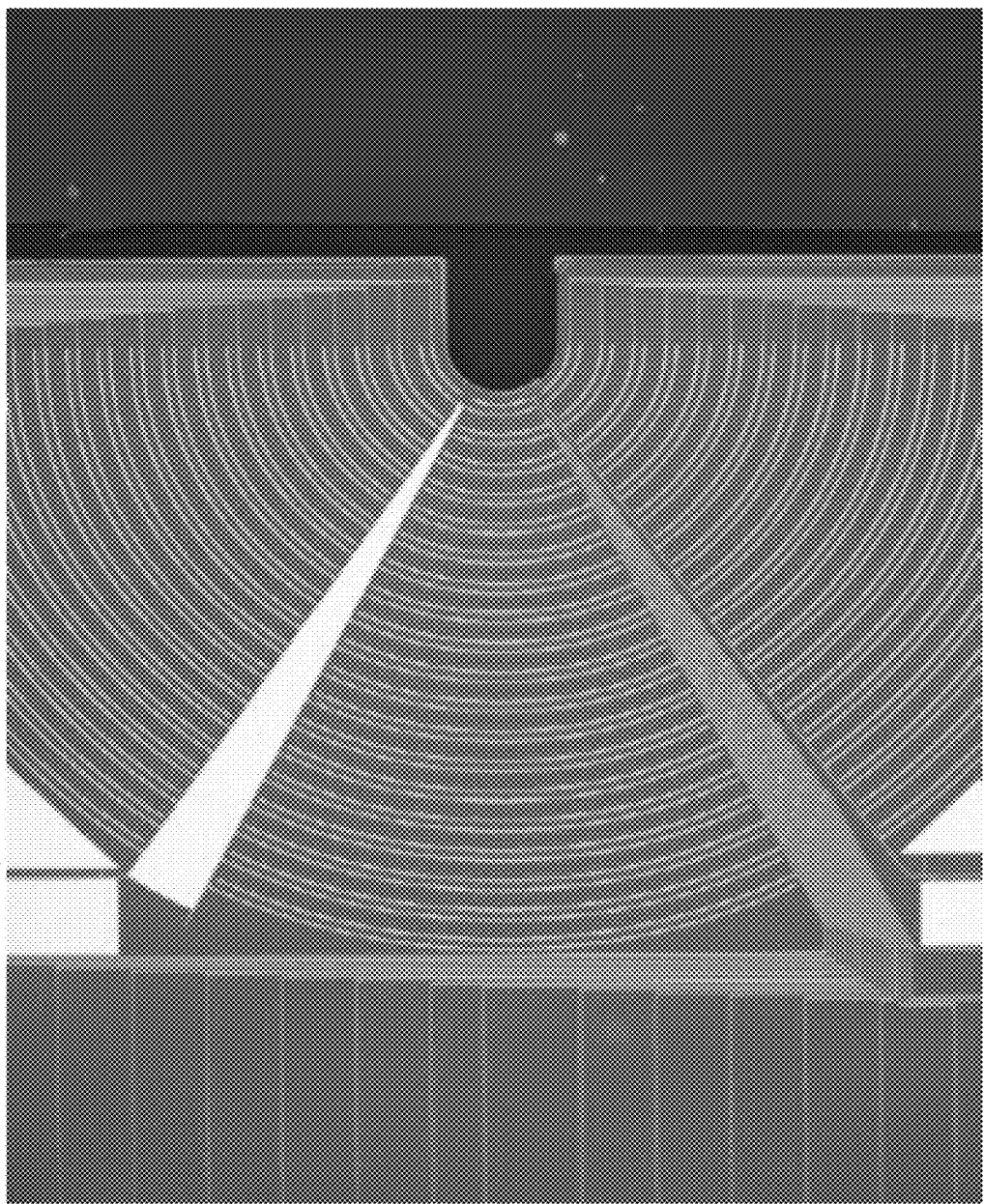
FIGS. 11-13 depict a photodiode array having 19 diodes in three 60° segments.
Figure 12:
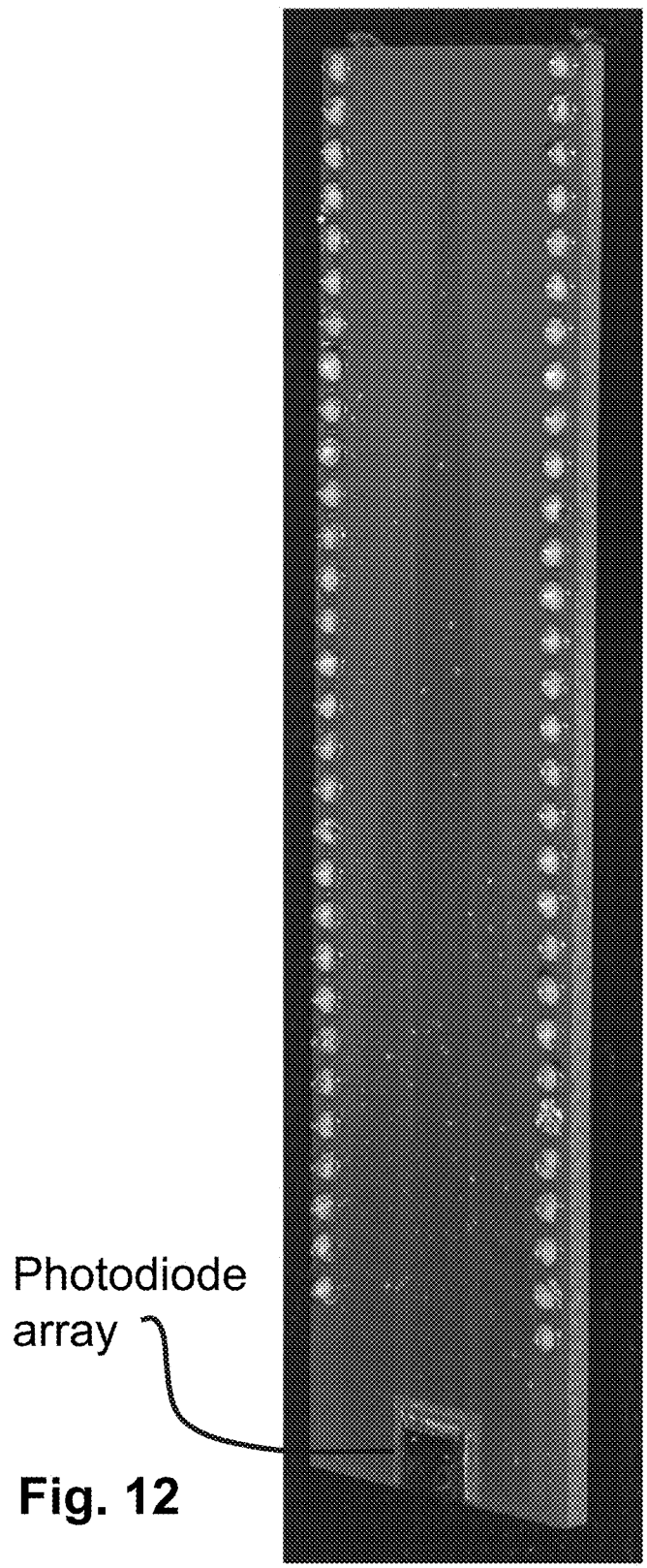
Figure 13:
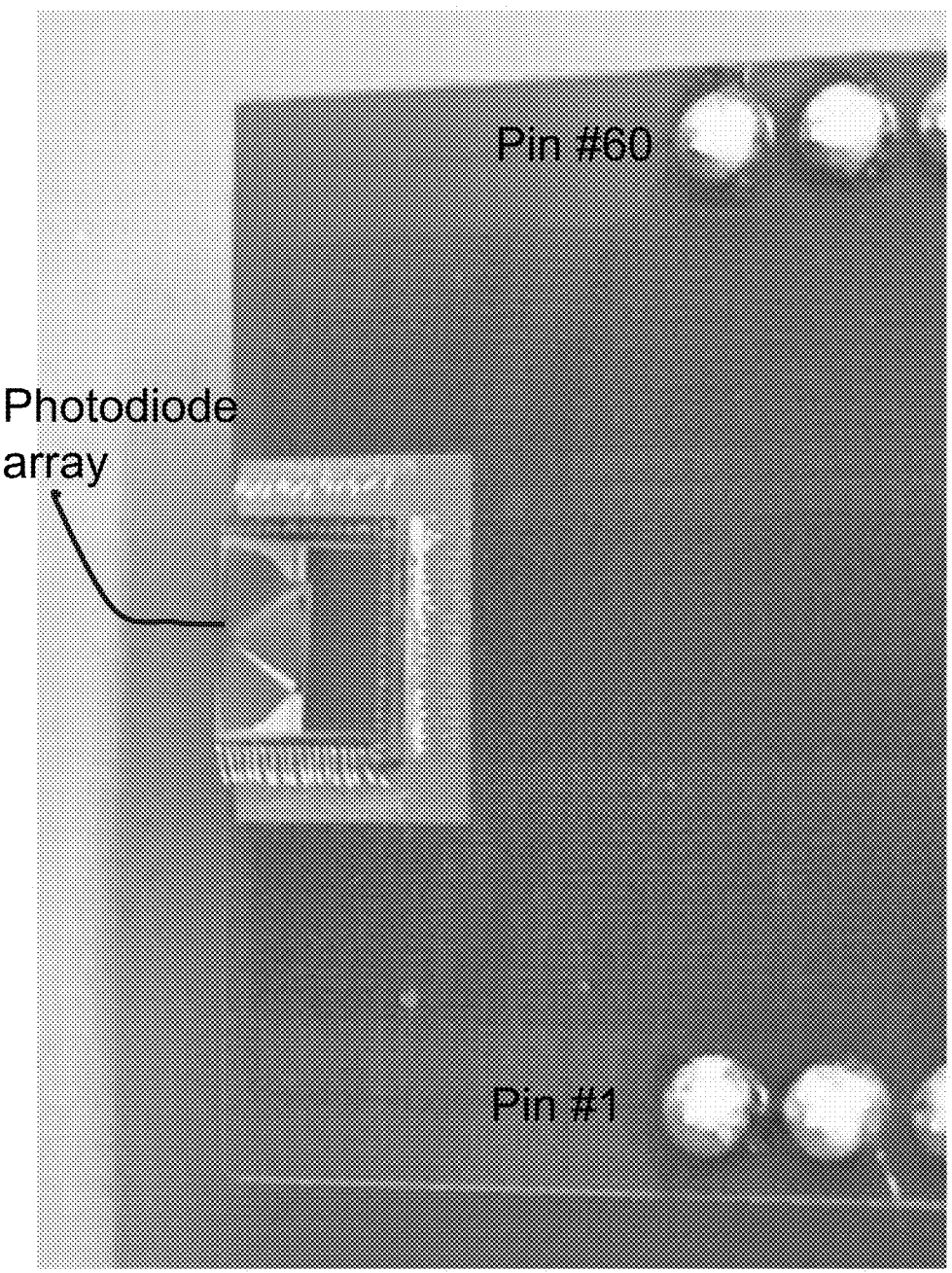

Regarding FIGS. 11-13, each diode is arranged to detect an 85 micrometer change in radius across a 60-degree segment. Dark Current for the photodiodes is on the order of 0.1 pA for the largest photodiode (furthest from center) and about 0.02 pA for the smallest photodiode (closest photodiode to the fiber, see FIG. 7). The photocurrent with 1 mW/cm² light intensity was ~4.5 microamps (largest diode furthest from center) and 0.5 microamps (smallest photodiode, nearest the notch). These current measurements depict the amount of current under different conditions. This data characterizes the performance of the photodiodes. The dark current is the amount of current that flows when there is no light. All diodes have a certain amount of dark current. The photocurrent is the amount of current that flows when light is present. The photocurrent varies with the light intensity. From the measurement of, for example, three sets of 19 radial diodes each has a 60-degree width, in angles of 0-60 degrees, 60-120 degrees, and 120-180 degrees, respectively. Measuring these diodes as sets A, B, and C, if set A≈B≈C then the propagation mode is expected to be $LP_{01}$ Similarly, if diode set A≈C, and B is much weaker, e.g. two times weaker, then the mode is expected to be $LP_{11}$. The materials used for the ground plane on the circuit may include aluminum, and the detector material may be Si. Alternate materials may be chosen for different laser wavelengths of choice. If the fiber is carrying a wavelength of light for which silicon is not a good detector, then a different semiconductor may be substituted. For example, if the wavelength is 1100 nm, Germanium may be substituted for the silicon.

FIGS. 12-13 depict the photodiode array of FIG. 11 mounted on a circuit board and wired in place. Pins 1-19: Photodiode connections, left third. Photodiode on pin #1 is nearest the notch. Pins 21-39: Photodiode connections, middle third. Photodiode on pin #39 is nearest the notch. Pins 42 -60: Photodiode connections, right third. Photodiode on pin #60 is nearest the notch. Pin 20, Pin 40: Common ground. The diodes are electrically connected; only one ground pin needs to be used. Pin 41: Backside ground. Header pin spacing: 0.1"

Figure 14:
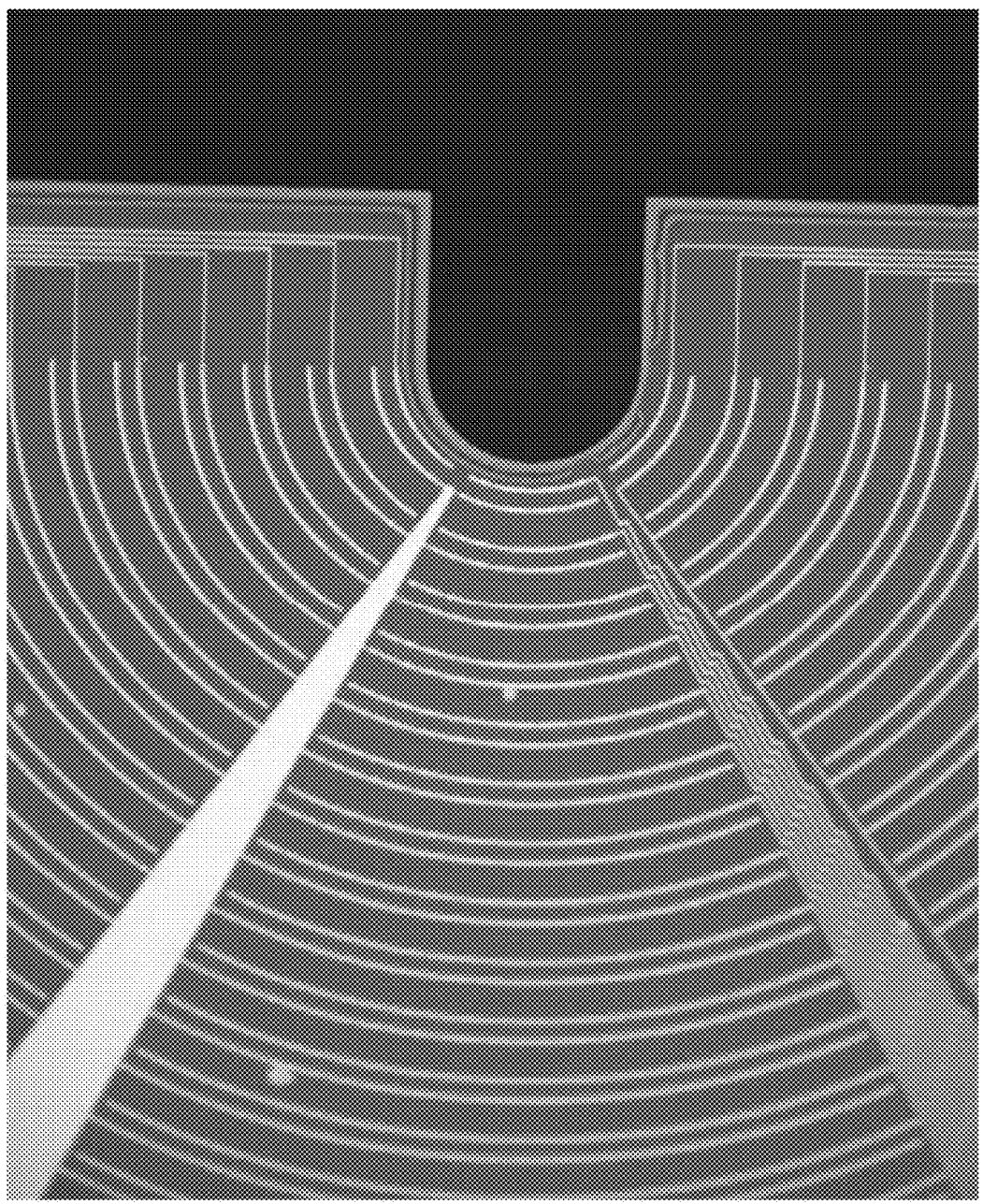
FIGS. 14-15 depict a photodiode array having seven diodes in three 60° segments.
Figure 15:
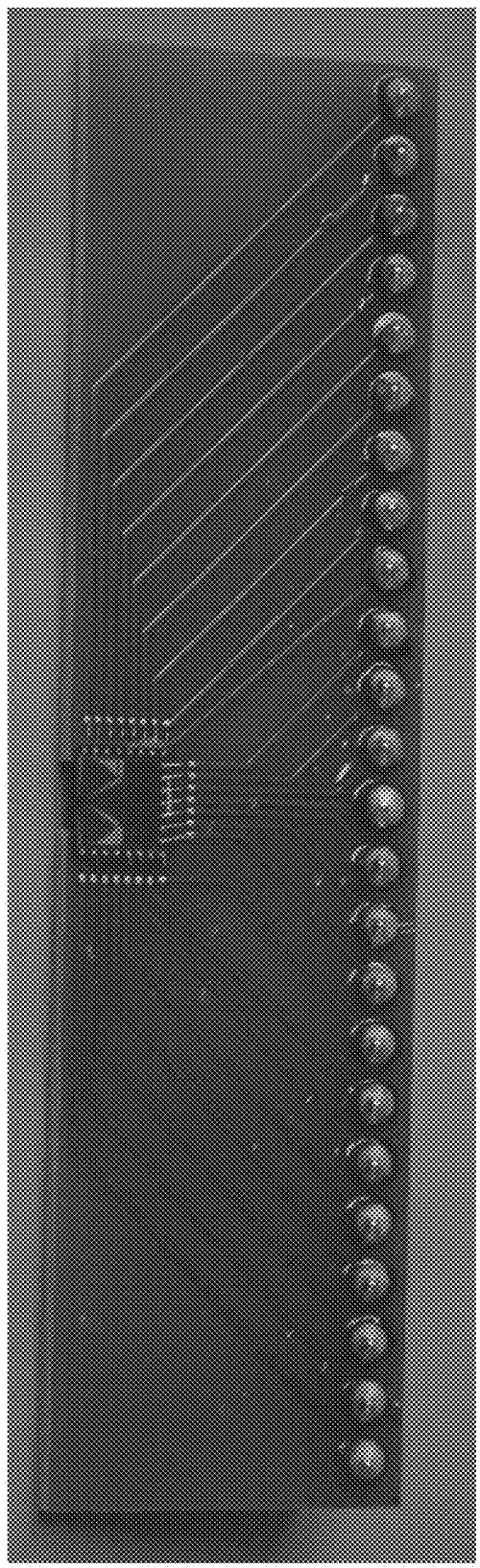

FIGS. 14-15 depict another embodiment of a photodiode array. This embodiment includes 21 photodiodes. The photodiodes are arranged in three 60° segments. Each of the segments includes seven (7) photodiodes in the radial direction. Each diode detects $\Delta r = r_{max} - r_{min} = 230$ µm.

Simulation Results:
Dark Current (simulation, 0V):
1 pA (largest photodiode, furthest from notch)
0.2 pA (smallest photodiode, nearest notch)

Photocurrent with 1 mW/cm2 light intensity (simulation, 0V):
6.8 µA (largest photodiode, furthest from notch)
0.75 µA (smallest photodiode, nearest notch).

Pin Summary:
Pins 1-7: Photodiode connections, left third. Photodiode on pin #1 is nearest the notch. Pins 9-15: Photodiode connections, middle third. Photodiode on pin #15 is nearest the notch. Pins 18-24: Photodiode connections, right third. Photodiode on pin #24 is nearest the notch. Pin 8, Pin 16: Common ground. Pin 17: Backside ground. The ground connections are electrically connected; only one ground pin needs to be used. Header pin spacing: 0.1"

Figure 16:
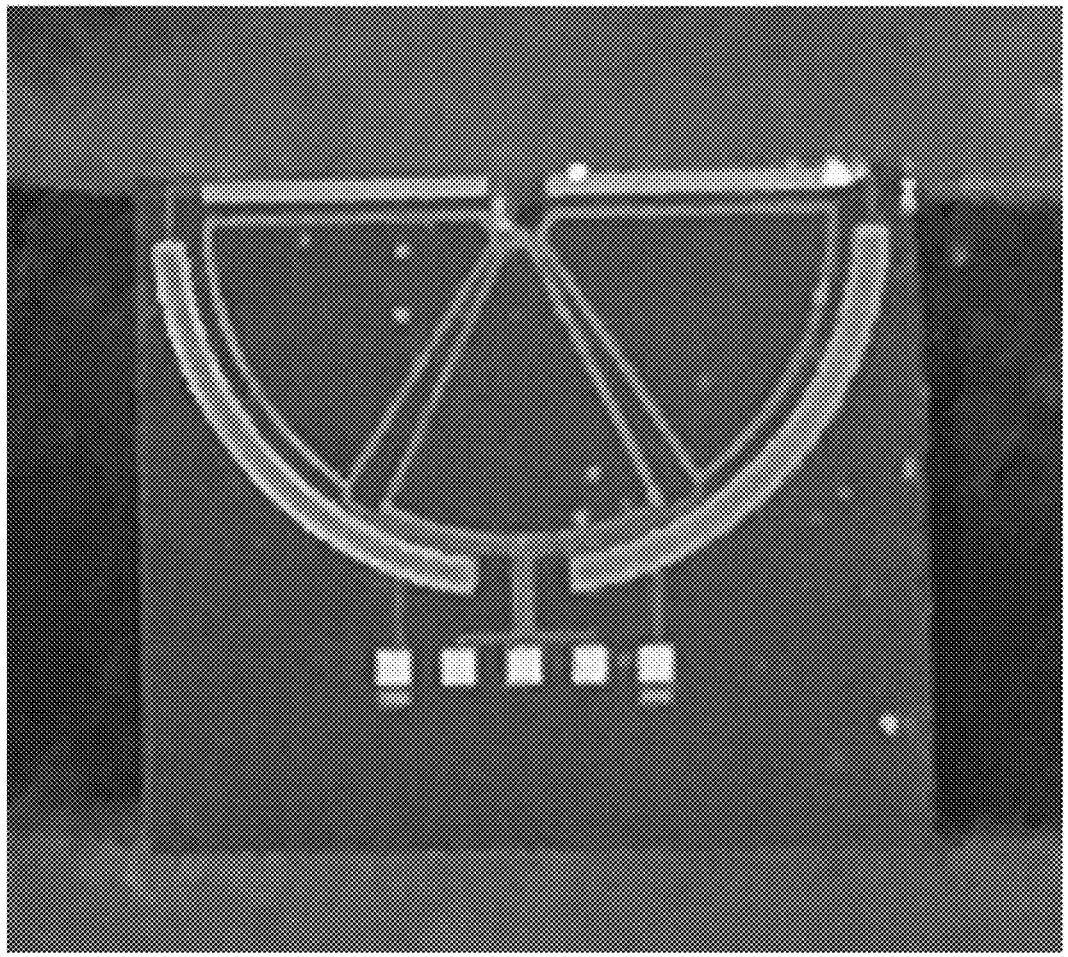
FIGS. 16-17 depict a photodiode array having three diodes in three 60° segments.
Figure 17:
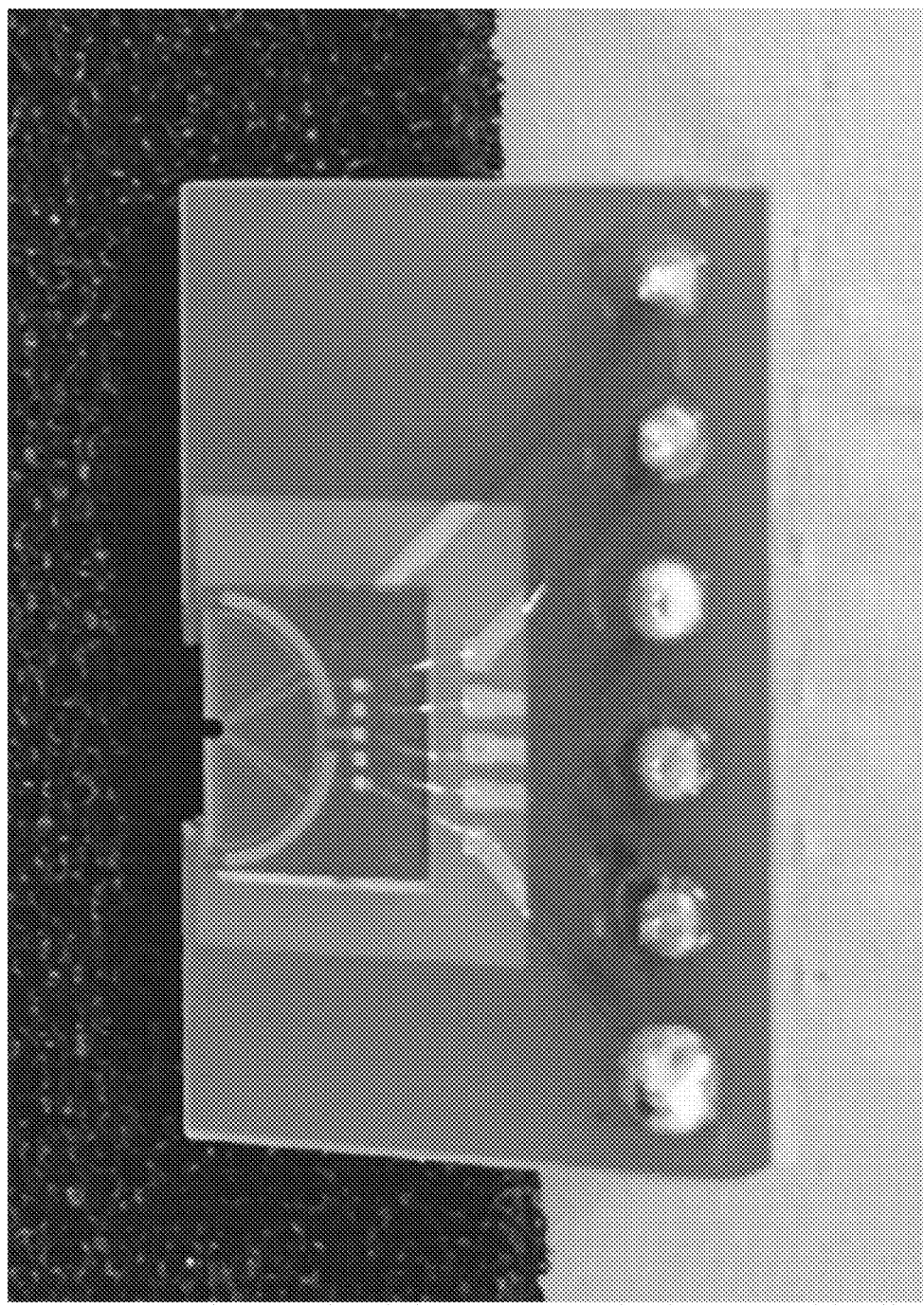

FIGS. 16-17 depict a further embodiment of a photodiode array. This embodiment includes only three (3) photodiodes. The photodiodes are arranged in three 60° segments.

Figure 18:
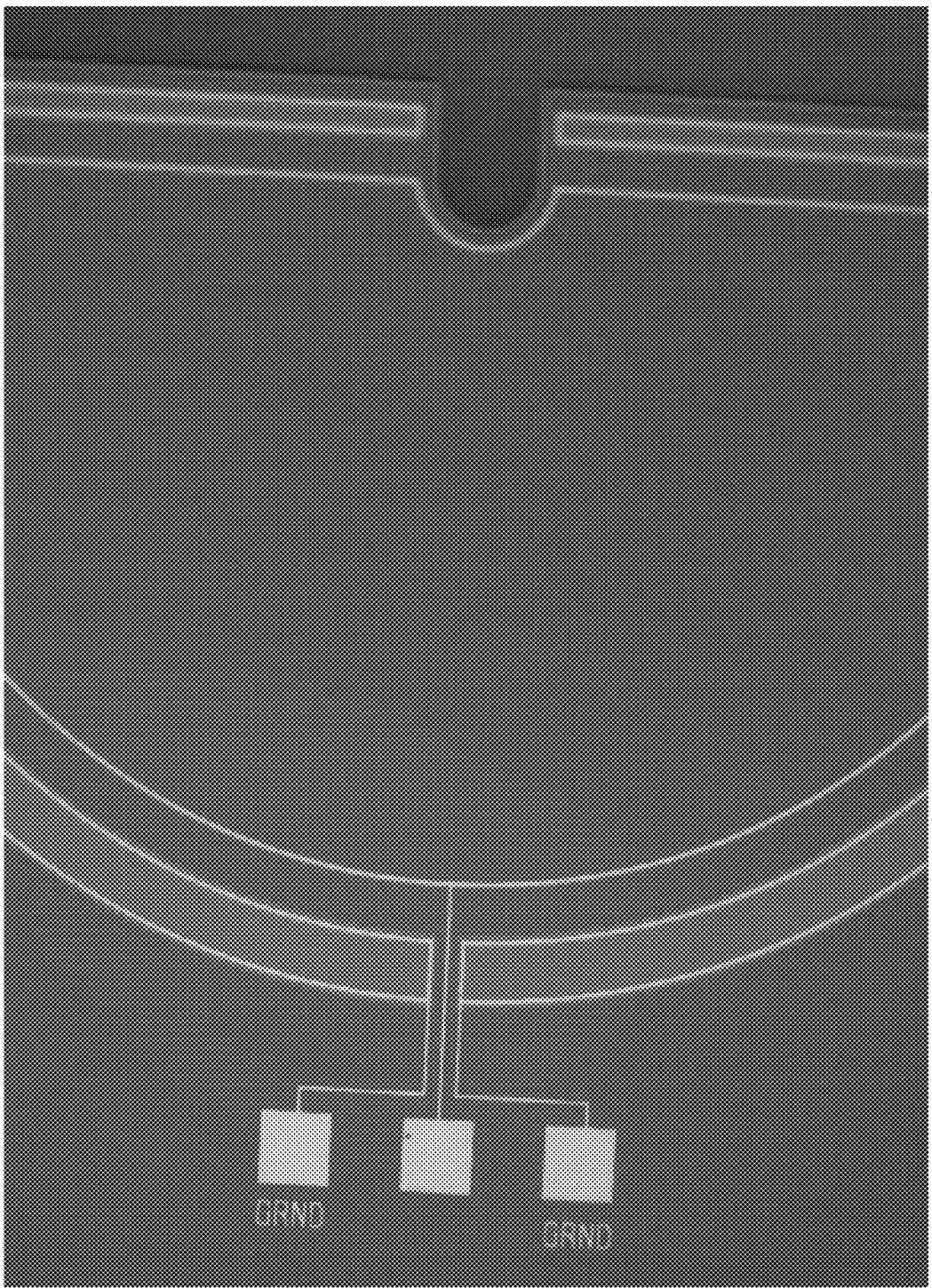
FIGS. 18-19 depict a photodiode array having a single 180° semicircular diode.
Figure 19:
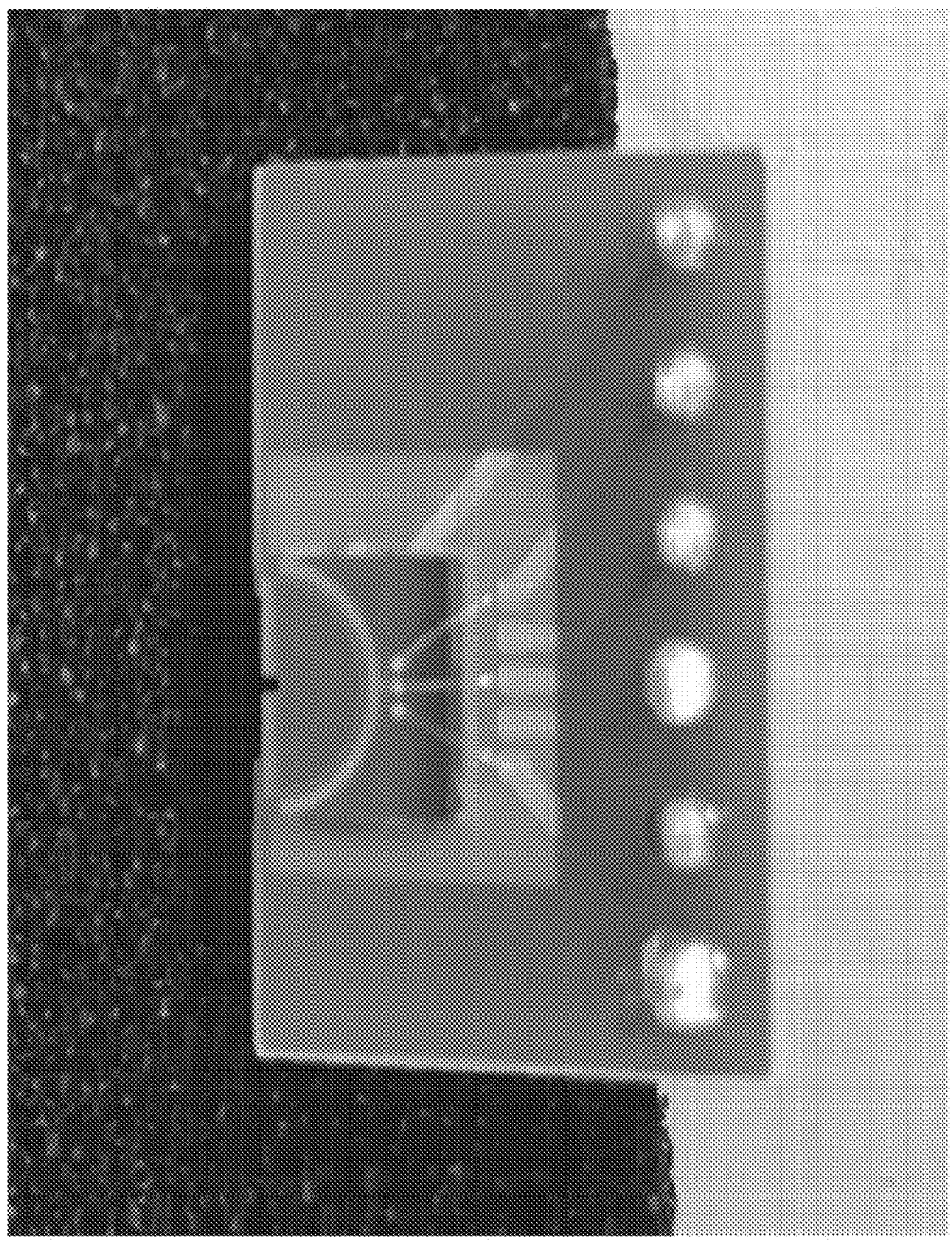

FIGS. 18-19 depict yet another embodiment of a photodiode array. This embodiment includes only one photodiode. The photodiode includes a single 180° semicircular diode with two (2) grounds.

Each embodiment was tested and functioned as designed.

The actual invention may be made using standard lithography techniques using a printed circuit board mounting and wirebonding for actual implementation. A blank silicon surface was cleaned and processed using a variety of deposition and etch steps combined with photolithography to create the diodes. With a typical die being about 5 mm=5 mm, many dies may be created from a 12" diameter Si wafer and processed accordingly. The sequence of processing steps involves masking and depositing using either e-beam or sputtering the desired materials, and subsequently etching away the mask material, as is typical in photolithography. Four-inch diameter Si wafers were used to make the dies in this example, producing approximately 300 diodes per wafer. Each die was then individually wire bonded to a custom circuit board for testing and evaluation. The circuit does not require biasing, merely precision placement of the fiber within the notch on the sensor, and voltage/current measurement during excitation of the laser scattering.

The invention may be changed to use different detector materials, e.g. to an arrangement optimized for different wavelengths of light if a Si detection scheme is not efficient in the wavelength of interest. For example, at 1550 nm Ge may be used if desired. Also, more complicated detector schemes may be used if a higher fidelity of the modes expected or desired, such as extending beyond 180 degrees to about 270 degrees, as well as adding more detector elements.

FIGS. 11-13 depicts another embodiment of the photodiode array.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A scattered light detector comprising:
   a first photodiode array comprising one or more photodiodes arranged in a planar, semicircular pattern on a substrate, each of the one or more photodiodes having an outer edge and an inner edge;

a second photodiode array, wherein the planes of the one or more photodiodes of the first and second photodiode arrays are oriented parallel to each other, the first and second photodiode arrays are facing each other, and are spaced a predetermined distance apart; and a notch perpendicular to each substrate and located adjacent the inner edge of each of the one or more diodes, and equidistant from the outer edges of each of the one or more photodiodes, the notch configured to accept an optical fiber oriented perpendicular to the plane of the one or more photodiodes.

2. The scattered light detector of claim 1, wherein there are two or more photodiodes.

3. The scattered light detector of claim 2, wherein the two or more photodiodes of each photodiode array are divided into two or more segments extending outwardly from the notch in a 60° arrangement having three concentric circle slices, with each 60° photodiode diode slice having 19 semicircular diodes spanning the 60° arrangement.

4. The scattered light detector of claim 1, wherein each of the one or more photodiodes shares a common electrical ground.

5. The scattered light detector of claim 1 wherein the predetermined distance is about 1 mm.

\* \* \* \* \*